US010965294B1

(12) United States Patent
Seetharaman et al.

(10) Patent No.: US 10,965,294 B1
(45) Date of Patent: Mar. 30, 2021

(54) STORAGE CELL RING-BASED TIME-TO-DIGITAL CONVERTER

(71) Applicant: Texas Instruments Incorporated, Dallas, TX (US)

(72) Inventors: Narayanan Seetharaman, Unterschleissheim (DE); Patrick Matthias Georg Forster, Freising (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/689,052

(22) Filed: Nov. 19, 2019

(51) Int. Cl.
*H03L 7/099* (2006.01)
*G04F 10/00* (2006.01)
*H03L 7/087* (2006.01)

(52) U.S. Cl.
CPC .......... *H03L 7/0996* (2013.01); *G04F 10/005* (2013.01); *H03L 7/087* (2013.01)

(58) Field of Classification Search
CPC .............................. H03L 7/0996; G04F 10/005
See application file for complete search history.

(56) References Cited

U.S. PATENT DOCUMENTS

| | | | |
|---|---|---|---|
| 10,671,025 B2 * | 6/2020 | Mautner | G04F 10/005 |
| 10,686,452 B2 * | 6/2020 | Deng | H03L 7/087 |
| 2007/0001661 A1 | 1/2007 | Loke et al. | |
| 2008/0049498 A1 | 2/2008 | Werner et al. | |
| 2008/0225615 A1 | 9/2008 | Carpenter et al. | |
| 2012/0063195 A1 | 3/2012 | Lam et al. | |

OTHER PUBLICATIONS

International Search Report in corresponding PCT Application No. PCT/US2020/059627, dated Feb. 4, 2021 (2 pages).

* cited by examiner

*Primary Examiner* — Lincoln D Donovan
*Assistant Examiner* — Colleen J O Toole
(74) *Attorney, Agent, or Firm* — John R. Pessetto; Charles A. Brill; Frank D. Cimino

(57) ABSTRACT

In described examples, a storage cell ring includes circularly coupled storage cells. Each storage cell includes a respective capacitor for generating a respective integrated voltage responsive to a respective duration a respective storage cell is selected, a respective thresholding converter for generating a respective thresholded signal for indicating whether the respective integrated voltage has crossed a threshold, and respective selection circuitry configured to generate a respective select signal responsive to select signals generated by a respective adjacent storage cells. The ring is coupled to an analog quantifier for generating a conversion value responsive to the generated respective integrated voltage and a respective select signal. The ring is coupled to a loop counter for generating a loop count value responsive to changes of values of at least some of the respective thresholded signals. The conversion value and the loop count value can comprise a time measurement.

15 Claims, 12 Drawing Sheets

US 10,965,294 B1

STORAGE CELL RING-BASED TIME-TO-DIGITAL CONVERTER

BACKGROUND

In some electronic systems, digital circuits are arranged to control and/or measure electrical quantities of various kinds of electronic circuits (e.g., analog circuits). In some such electronic circuits, timing information of electronic signals is measured and converted to a digital quantity. The measurements can be used to control and/or monitor the timing of the generation of the electronic signals being measured. The stability, resolution and speed of such measurements and conversions is limited by the size, speed, and power consumption of the various components employed in the conversions.

SUMMARY

In described examples, a storage cell ring includes circularly coupled storage cells. Each storage cell includes a respective capacitor for generating a respective integrated voltage responsive to a respective duration a respective storage cell is selected, a respective thresholding converter for generating a respective thresholded signal for indicating whether the respective integrated voltage has crossed a threshold, and respective selection circuitry configured to generate a respective select signal responsive to select signals generated by a respective adjacent storage cells. The ring is coupled to an analog quantifier for generating a conversion value responsive to the generated respective integrated voltage and a respective select signal. The ring is coupled to a loop counter for generating a loop count value responsive to changes of values of at least some of the respective thresholded signals. The conversion value and the loop count value can comprise a time measurement.

DETAILED DESCRIPTION

Figure 1:
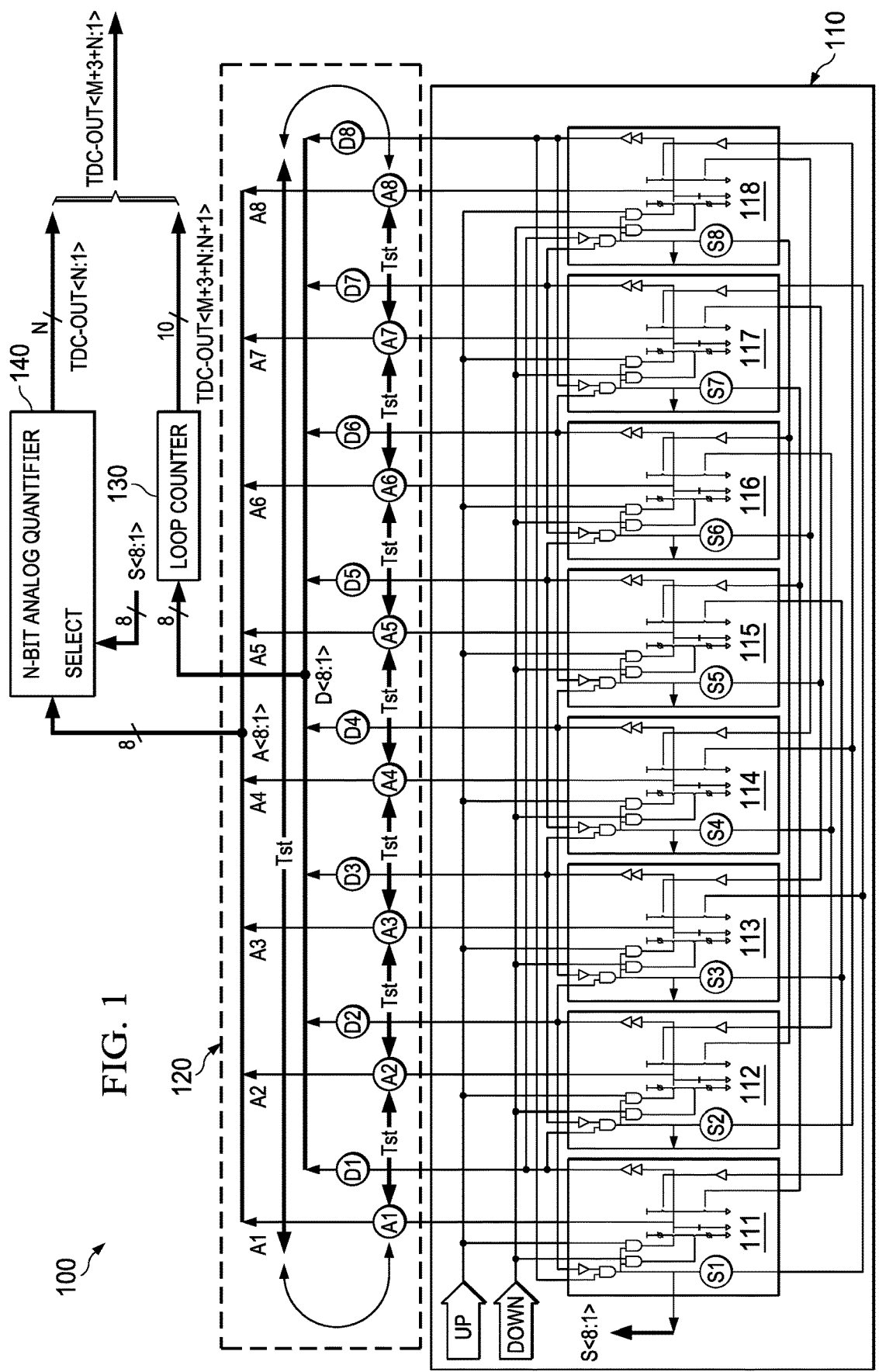
FIG. 1 is a system diagram showing an example of a bidirectional storage cell ring-based time-to-digital converter (TDC) that includes an analog-to-digital converter and a loop counter for respectively generating less-significant bits and more-significant bits of a resulting conversion.

In the drawings, like reference numerals refer to like elements, and the various features are not necessarily drawn to scale.

Various electronic circuits include analog-to-digital converters for converting a time-domain signal into a thresholded signal (e.g., which can include at least one digital quantity, code, number, or value). Such circuits can be employed in a variety of end-user applications (e.g., stopwatches, signal conditioning, and feedback control). The techniques described herein can be applied to virtually any such end-user application. One such application includes at least one digital phase-lock loop (PLL) circuit in which a frequency of oscillation of a PLL is compared against a frequency of a reference signal, at least one feedback signal is generated responsive to a quantity of the reference signal, and the oscillation of the PLL is controlled responsive to the feedback signal. The oscillation of the PLL can be controlled so as to match with (e.g., to be locked onto) the frequency of the reference signal.

A digital PLL includes a time-to-digital converter (TDC). A TDC can be configured to convert a time or phase difference between a reference clock and a feedback clock (e.g., generated in response to a previous value of a feedback signal). The time or phase difference is converted into a corresponding digital code. The digital code is computationally processed to generate the feedback signal. The feedback signal is input by an oscillator that generates a feedback clock. The oscillator is configured to tune the oscillator's frequency in response to the feedback signal (e.g., so that the feedback clock is a feedback-controlled clock that is controlled by the feedback signal and so that the feedback clock is locked onto the reference clock).

A TDC is adapted to receive output an indication of a phase relationship (e.g., phase offset) between the reference clock and the feedback-controlled clock. The indication of a phase relationship between the reference clock and the feedback-controlled clock includes an indication of a start time and an indication of a stop time. In response to the indication of the phase relationship, the TDC is adapted to convert a time difference between two events (e.g., a rising or a falling edge of a reference clock and a rising or a falling edge of the feedback-controlled clock) represented in an analog domain into a discrete value in the digital domain. For example, time can be measured as an approximation within the infinitesimal analog domain and converted by the TDC into a digital code. The performance of a particular kind of TDC can render the particular kind of TDC as being suitable or unsuitable for a particular end-user application.

The performance (e.g., accuracy, speed, or resolution) of TDCs is subject to being operationally limited by the techniques and architectures included by a TDC. In a first example, the resolution (e.g., resolution in time) of a TDC is limited to the time-period of a clock (e.g., high-speed clock) for toggling a counter corresponding to an input phase error (e.g., a phase error that exists between the reference clock and the feedback clock). In a second example in which the TDC includes an analog-to-digital converter (ADC), the resolution (e.g., resolution in voltage) is limited to the resolution of the ADC, which is adapted to convert (e.g., sample) an input phase error voltage into a digital code (e.g., the input phase error can be converted into a corresponding voltage by a PFD-Charge pump).

As described herein, an example TDC includes an 8-stage bidirectional storage cell ring (BDSCR). The BDSCR can oscillate (e.g., propagate oscillations) in a first direction (e.g., clockwise, CW) or in a second direction (e.g., counterclockwise, CCW). The BDSCR is adapted to oscillate in either a CW or a CCW direction responsive to an input phase error, so that the direction of BDSCR oscillation is maintained for the duration corresponding to the input phase error. The BDSCR oscillation includes a "ring edge" (described herein below with respect to FIG. 5A and FIG. 5B), which indicates a leading edge of an oscillating signal digitally propagated in a loop within the BDSCR.

During the BDSCR oscillation (e.g., while the BDSCR is oscillating in either the CW or the CCW direction), the number of ring edges is counted using a loop counter. The BDSCR oscillation can be stopped such that stored BDSCR oscillation quantities (e.g., internal voltages) can be sampled. For example, the oscillation can be stopped for sampling on a periodic basis, where the resolution in time of the TDC can be determined responsive to the sampling period.

Responsive to a signal being asserted to stop the BDSCR oscillation, two outputs (from two adjacent SCRs) of the BD-SCR hold analog voltages, and the other six outputs hold digital voltage values (where each discrete voltage for representing a binary value can be generated responsive to a respective power rail "Vdd" or "Vss"). One of the two analog voltages is sampled and forwarded to an ADC for conversion of the analog voltage into a corresponding digital code. The corresponding digital code indicates a value of a partial (e.g., less than full) propagation time from a first storage cell to an adjacent storage cell (e.g., intercell partial propagation time). The ADC output value and loop counter value (e.g. generated each sampling period) respectively provide the less-fine resolution portion and the more-fine resolution portion of the output bits of the TDC (e.g., the resolution in time of the conversion value of the ADC is more precise than a resolution in time of the loop count value). The loop counter, the BDSCR and the ADC are re-initialized each sampling period (e.g., responsive to receiving a phase error input for a successive sampling period).

FIG. 1 is a system diagram showing an example bidirectional storage cell ring-based time-to-digital converter (TDC) that includes an analog-to-digital converter and a loop counter for respectively generating less-significant bits and more-significant bits of a resulting conversion. Generally described, the TDC 100 is an example TDC that includes a ring 110, an analog quantifier 140 and a loop counter 130. The ring diagram 120 is a conceptual flow diagram of the ring 110.

The TDC 100 includes at least one input, for receiving a signal for which a time measurement is to be determined. In the example, two inputs are adapted to receive an up signal (UP) signal and the down (DOWN) signal. The UP signal and the DOWN signal can be received from a phase-frequency detector (PFD), such as the PFD 450 described hereinbelow. Operation of the TDC and a PFD are described hereinbelow with respect to FIG. 4.

The TDC 100 includes an output bus for outputting a digital value of the time measurement. In the example, the digital output of the loop counter 130 can be concatenated as more-significant bits to the less-significant bits output by the analog quantifier 140, so that a combined conversion result can be generated that includes more resolution than the resolution inherent to an ADC (e.g., ADC 444, described hereinbelow) included by the analog quantifier 140. In an example, the less-significant bits of a digital value (e.g., a digital word or digital output) are less significant than a most-significant bit of the digital value, and the more-significant bits of the digital value are more significant than the least-significant bit of the digital value.

The combination of the loop counter 130 digital output with the ADC digital output to form a higher resolution digital output (as described herein) can both reduce the complexity of the ADC that would otherwise be required to obtain a same resolution of the digital output of the ADC. Further, the reduced complexity of the ADC facilitates smaller layouts and higher speeds of conversions performed by the ADC.

The ring 110 is an example bidirectional storage cell ring that is configured as a ring oscillator. The ring 110 is coupled to a timing output (e.g., PFD 450 of FIG. 4) and includes storage cells coupled in a loop. The loop can include eight storage cells, such as storage cell 111, storage cell 112, storage cell 113, storage cell 114, storage cell 115, storage cell 116, storage cell 117 and storage cell 118. The storage cells are mutually coupled in a loop, so that each storage cell has a logically adjacent storage cell in a clockwise direction and has a logically adjacent storage cell in a counterclockwise direction. Each such storage cell includes a timing input(s) coupled to receive the UP signal and the DOWN signal (e.g., coupled from a timing output of such as PFD 450, described hereinbelow), so that the ring 110 (for example) can be selectively configured to oscillate in a clockwise or a counterclockwise direction. The ring 110 is configured as a ring oscillator that is configured to start oscillating in response to the indication of the start time and is configured to stop oscillating in response to the indication of the stop time.

Each storage cell includes inputs to receive a left signal (L), right signal (R), an S(−2) signal and an S(+2) signal. The left signal (L) is coupled to the Dx output of a first CW-adjacent storage cell, the right signal (R) is coupled to the Dx output of a first CCW-adjacent storage cell, the S(−2) signal is coupled to the S output of a second CW-adjacent storage cell that is CW-adjacent to the first CW-adjacent storage cell, and the S(+2) signal is coupled to the S output of a second CCW-adjacent storage cell that is CCW-adjacent to the first CCW-adjacent storage cell. In an example, the first and last storage cells of a linear arrangement of storage cells can be a pair of adjacent storage cells in a storage cell ring (e.g., where a D<1> output of a first cell is coupled to an R input of the last cell). The S output of each storage cell is bitwise concatenated in order to form a selection bus S (e.g., S<8:1>). (In various examples, an adjacent storage cell is a logically adjacent storage cell, where a ring edge can propagate from a first storage cell to a second storage cell without first propagating through any other storage cell, regardless of a direction of oscillation of the ring edge.)

Each storage cell is configured to generate (at a storage cell output) a cell-selected (S) signal responsive to the L signal and the R signal and to generate an analog output (Ax) signal and a digital output (Dx) signal responsive to the UP signal and the DOWN signal. Fewer storage cells (e.g., a total of six storage cells, as compared to eight storage cells) in a ring can be used, although the use of fewer storage cells in a ring tends increase design complexity as a result of using base-seven-or-less arithmetic for counting a number of storage cells through which a ring edge has propagated, for example. An example storage cell is described hereinbelow with respect to FIG. 2.

The ring diagram 120 is a conceptual flow diagram of the ring 110 for showing clockwise (CW) and counterclockwise (CCW) oscillations (e.g., propagations of oscillations) of the ring 110. In an example, the ring 110 is configured selectively oscillate in a first direction during a first period of time and in a second direction during a second period of time that follows the first period of time. In a CW rotation, a ring edge propagates from node A1 (associated with storage cell 111 and node D1), then to node A8 (associated with storage cell 118 and node D8), then to node A7 (associated with storage cell 117 and node D7), then to node A6 (associated with storage cell 116 and node D6), then to node A5 (associated with storage cell 115 and node D5), then to node A4 (associated with storage cell 114 and node D4), then to node A3 (associated with storage cell 113 and node D3), then to node A2 (associated with storage cell 112 and node D2), then to node A1, then to node A8, and so on until an indication for sampling is received. In a CCW direction, a ring edge propagates from node A1, then to node A2, then to node A3, then to node A4, then to node A5, then to node A6, then to node A7, then to node A8, then to node A1, and so on until an indication for sampling is received. Ring edge propagation is described hereinbelow with respect to FIG. 3 and FIG. 5A and FIG. 5B.

The analog (Ax) signal output for each storage cell is commonly grouped to form the analog bus A<8:1>, the digital (Dx) signal output for each storage cell is commonly grouped to form the digital bus D<8:1>, and the select (Sx) signal output for each storage cell is commonly grouped to form the status bus S<8:1>. The analog bus A<8:1> is coupled to a select input (e.g., that includes eight terminals) of the analog quantifier 140. Operation of the analog quantifier 140 is described hereinbelow with respect to FIG. 4 and FIG. 6. The digital bus D<8:1> is coupled to an input (e.g., that includes eight terminals) of the loop counter 130. Operation of the loop counter 130 is described hereinbelow with respect to FIG. 4. The status bus S<8:1> is coupled to the select input (e.g., that includes eight terminals) of the analog quantifier. Operation of the analog quantifier 140 is described hereinbelow with respect to FIG. 4.

The loop counter 130 is configured having an "M+3"-bit output bus TDC-OUT<M+3:1> (e.g., 8-bits wide) and the analog quantifier 140 is configured having an N-bit (e.g., 8 bits) output bus TDC-OUT<N:1>. The output bus TDC-OUT<N:1> is appended as less-significant bits to the loop counter 130 output bits (e.g., output bus TDC-OUT<M+3+N:N+1> to form the output bus TDC-OUT<M+3+N:1>.

Figure 2:
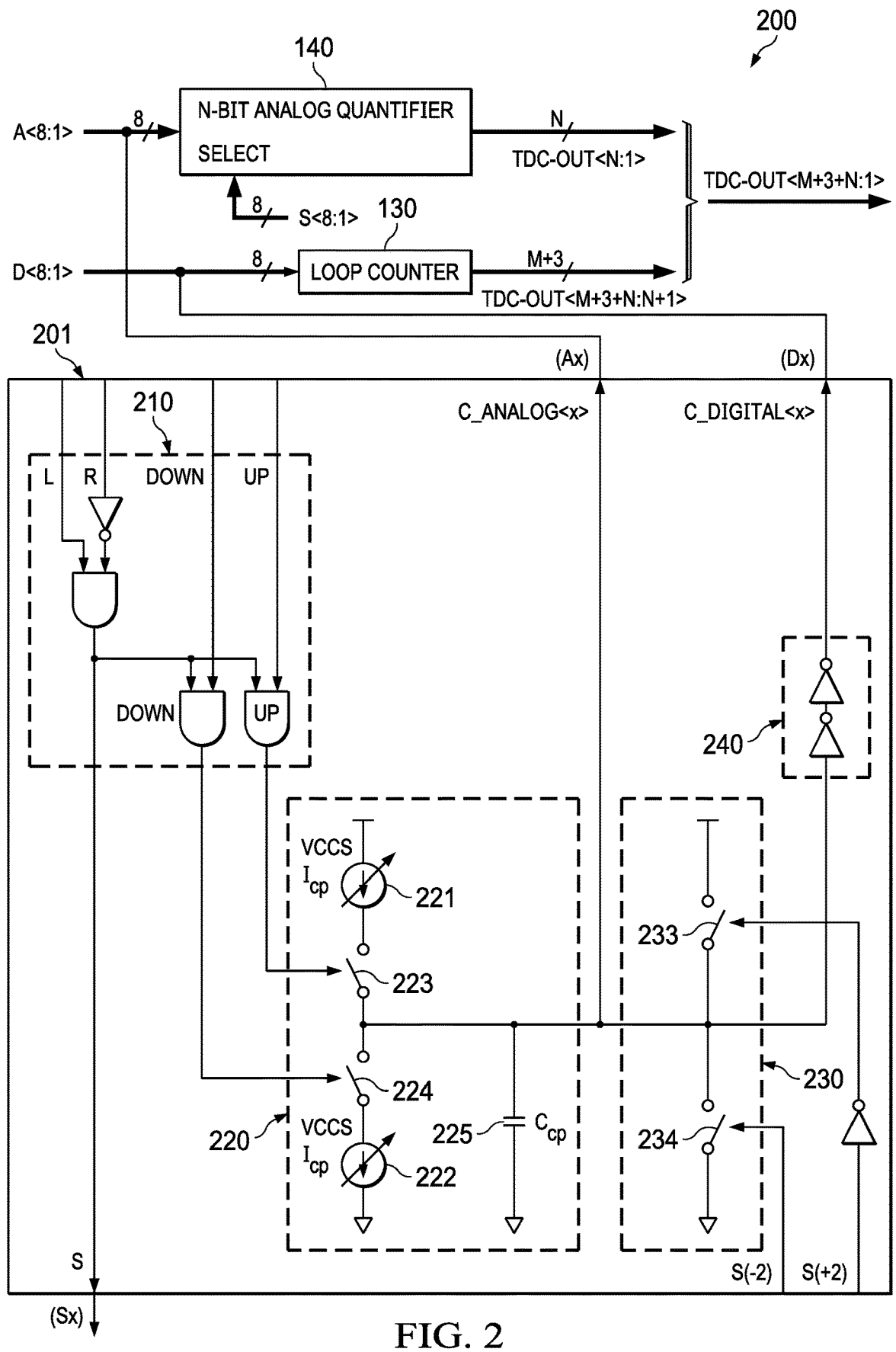
FIG. 2 is a system diagram showing an example bidirectional storage cell of a time-to-digital converter (TDC).

FIG. 2 is a system diagram showing an example bidirectional storage cell of a time-to-digital converter (TDC). Generally described, the circuit 200 is an example circuit that includes a storage cell 201. The storage cell 201 is a storage cell such as storage cell 111. The storage cell 201 includes an analog output Ax (C_ANALOG<x>) that is coupled to the analog bus A<8:1>, a digital output Dx (D_DIGITAL<x>) that is coupled to the digital bus D<8:1>, and a select output (Sx) that is coupled to the status bus S<8:1>. In an example, each storage cell 201 includes a respective capacitor (e.g., capacitor 225) and a respective switch (e.g., high-side switch 223), where the respective capacitor (e.g., capacitor 225) is configured to integrate to integrate a respective integrated voltage at a respective analog output responsive to a duration in which the respective switch (e.g., high-side switch 223) coupled to the respective capacitor (e.g., capacitor 225) is closed.

The analog quantifier 140 is configured to sample an integrated voltage (e.g., developed responsive to a pumped charge) stored by a charge pump capacitor $C_{cp}$ of a selected storage cell (e.g., storage cell 201). The analog quantifier 140 includes an ADC that can be selectively coupled to any one of the analog voltages of C_ANALOG<8:1>. The stored charge indicates a time duration for which the storage cell has been selected. The stored charge (when selected for sampling) develops a held voltage responsive to a sample-and-hold circuit (as described hereinbelow with respect to FIG. 6), from which the held voltage is converted into a digital value output on the bus TCD_OUT<N:1>. The storage cell to be selected for the analog-to-digital conversion is selected responsive to logical states of adjacent bits of the status bus S<8:1> (e.g., where first and last storage cells coupled in a loop are considered to be adjacent).

The loop counter 130 is configured to generate a digital value for output on the bus TDC-OUT<M+3+N:N+1> responsive to transitions of bits of the digital bus D<8:1>. Generally described, the digital value output by the loop counter 130 indicate a position of a ring edge as the storage cell ring oscillates and indicates a number of storage cells through which the ring edge has traversed. In an example, a less-significant portion of the digital value of D<8:1> indicates a position of a ring edge (e.g., within a loop) as the storage cell oscillates and a more-significant portion of the digital value of D<8:1> can be used to indicate a number of loops (e.g., a number of times the ring edge has traversed the entire storage cell ring). The output of the loop counter 130 and the output of the analog quantifier 140 are concatenated to form the output bus TDC-OUT<M+3+N:1>, so that a time-to-digital conversion can be determined having a voltage resolution greater (e.g., more precise) than the resolution of the output of the loop counter 130. Low latency times of the storage cell can increase the oscillation rate of the storage cell ring that includes the storage cell 201, so that, for example, measurements of 1 picosecond resolution can be made (as described hereinbelow with respect to FIG. 7, FIG. 8, FIG. 9, and FIG. 10.

The storage cell 201 includes a controller 210, a charge pump 220, a discharge/precharge circuit 230 and a thresholding converter 240.

The controller 210 is a selection circuit that includes inputs respectively coupled to receive a left signal (L), right signal (R), a DOWN signal and an UP signal. The controller 210 is configured to assert (at a first output) the S signal (which indicates that the storage cell 201 has been selected) responsive to a left-adjacent cell being selected (e.g., by the L signal being digitally high) and responsive to a right-adjacent cell not being selected (e.g., by the R signal being digitally low). In an example, the controller 210 is configured to generate at a select output a respective select signal to select its including storage cell (e.g., storage cell 201, which includes the controller 210) responsive to a value of the respective select signal output of a respective adjacent storage cell. The controller 210 is configured to output a respective select signal (e.g., Sx) at the respective select signal output S. For each storage cell (e.g., 201) in a ring (e.g., 110), a respective selection circuit (e.g., controller 210) is configured to generate a respective select signal at the selection output (e.g., Sx) of each respective selection circuit.

The controller 210 is configured to assert (at a second output of the controller 210) a local DOWN signal responsive to the received DOWN signal and the S signal. The second output is coupled to a control terminal of the low-side switch 224 of the charge pump 220. The charge pump 220 is configured to controllably (e.g., at a controlled rate) drain charge stored in the charge pump capacitor $C_{cp}$ (coupled to a node between the high-side switch 223 and the low-side switch 224) responsive to the local DOWN signal and the current $I_{cp}$ conducted by the current source 222. The voltage is an integrated voltage that is developed at the high side (e.g., the charge pump 220 output node C_ANALOG<x>) of the charge pump capacitor $C_{cp}$. The integrated voltage indicates a time period corresponding to a time duration of the assertion of the local DOWN signal (e.g., the period of time in which the storage cell 201 has been selected).

The controller 210 is configured to assert (at a third output of the controller 210) a local UP signal responsive to the received UP signal and the S signal. The third output is coupled to a control terminal of the high-side switch 223 of the charge pump 220. The charge pump 220 is configured to controllably store charge in the charge pump capacitor $C_{cp}$ responsive to the local UP signal and the current $I_{cp}$ conducted by the current source 221. The voltage ANALOG<x> is an analog voltage developed at the high side of the charge pump capacitor $C_{cp}$ indicates a time period corresponding to a time duration of the assertion of the local UP signal (e.g., the period of time in which the storage cell 201 has been selected).

The discharge/precharge circuit 230 is coupled to the charge pump 220 output node C_ANALOG<x>. The discharge/precharge circuit 230 includes the switch 234, which has a control terminal coupled to the S(−2) signal, so that the switch 234 is configured to discharge the charge pump capacitor $C_{cp}$ responsive to the S(−2) signal (e.g., responsive to the storage cell that is coupled to the second-leftmost-CW-adjacent storage cell being selected). The discharge/precharge circuit 230 includes the switch 233, which has a control terminal coupled to the S(+2) signal, so that the switch 233 is configured to precharge the charge pump capacitor $C_{cp}$ responsive to the S(+2) signal (e.g., responsive to the storage cell that is coupled to the second-rightmost-CCW-adjacent storage cell being selected). The strength (e.g., current capacity) of the switches 233 and 234 is stronger than the current capacities of the high-side switch 223 and the low-side switch 224 of the charge pump 220 (e.g., so that the charge pump 220 output node C_ANALOG<x> can be completely charged or discharged during each oscillation of the storage cell ring that includes the storage cell 201).

The thresholding converter 240 includes an input coupled to the charge pump 220 output node C_ANALOG<x> and an output coupled to the output C_DIGITAL<x>. The thresholding converter 240 is configured to convert the analog voltage developed at the charge pump 220 output node C_ANALOG<x> to a digital value (e.g., bit) and to assert the result at the output C_DIGITAL<x>. For example, the thresholding converter 240 is configured to output a thresholded signal. The thresholded signal is output as a logic one (high) when the voltage developed at the charge pump 220 output node C_ANALOG<x> exceeds a first threshold, and is output as a logic zero (low) when the voltage developed at the charge pump 220 output node C_ANALOG<x> is below a second threshold. The first threshold is greater than or equal to a voltage of the second threshold. For each storage cell (e.g., 201) in a ring (e.g., 110), a respective thresholding converter (e.g., 240) is configured to generate at a respective digital output a respective thresholded signal for indicating whether the respective integrated voltage has crossed a threshold.

In another example of the storage cell 201, one of the inputs for the signal UP or DOWN is coupled to ground, so that the storage cell ring that includes the storage cell oscillates in a single direction. Responsive to the input for the UP signal being coupled to ground (and the DOWN signal being asserted), the storage cell ring that includes the storage cell 201 is configured to oscillate in a CCW direction (so that the charge pump 220 output node C_ANALOG<x> is precharged responsive to the S(+2) signal, and so that the charge pump 220 output node C_ANALOG<x> is discharged responsive to the DOWN signal). Responsive to the input for the DOWN signal being coupled to ground (and the UP signal being asserted), the storage cell ring that includes the storage cell 201 is configured to oscillate in a CW direction (so that the charge pump 220 output node C_ANALOG<x> is discharged responsive to the S(−2) signal, and so that the charge pump 220 output node C_ANALOG<x> is charged responsive to the DOWN signal).

In an example, each of the storage cells includes a respective selection circuit (e.g., 111 of FIG. 1 and/or 210 of FIG. 2) having a first input (e.g., input L) coupled to an output (output Dx) of a respective adjacent storage cell (e.g., 118) and a second input (e.g., input UP) coupled to the timing output, wherein each of the storage cells includes a respective capacitor (e.g., 225) and a respective switch (e.g., 223) that includes a control terminal coupled to a selection output (e.g., output UP) of the respective selection circuit (e.g., 210) and that includes a current terminal coupled to the respective capacitor (e.g., 225), and wherein each (e.g., 111) of the storage cells includes a respective thresholding converter (e.g., 240) having an input coupled to the respective capacitor (e.g., 225).

Figure 3:
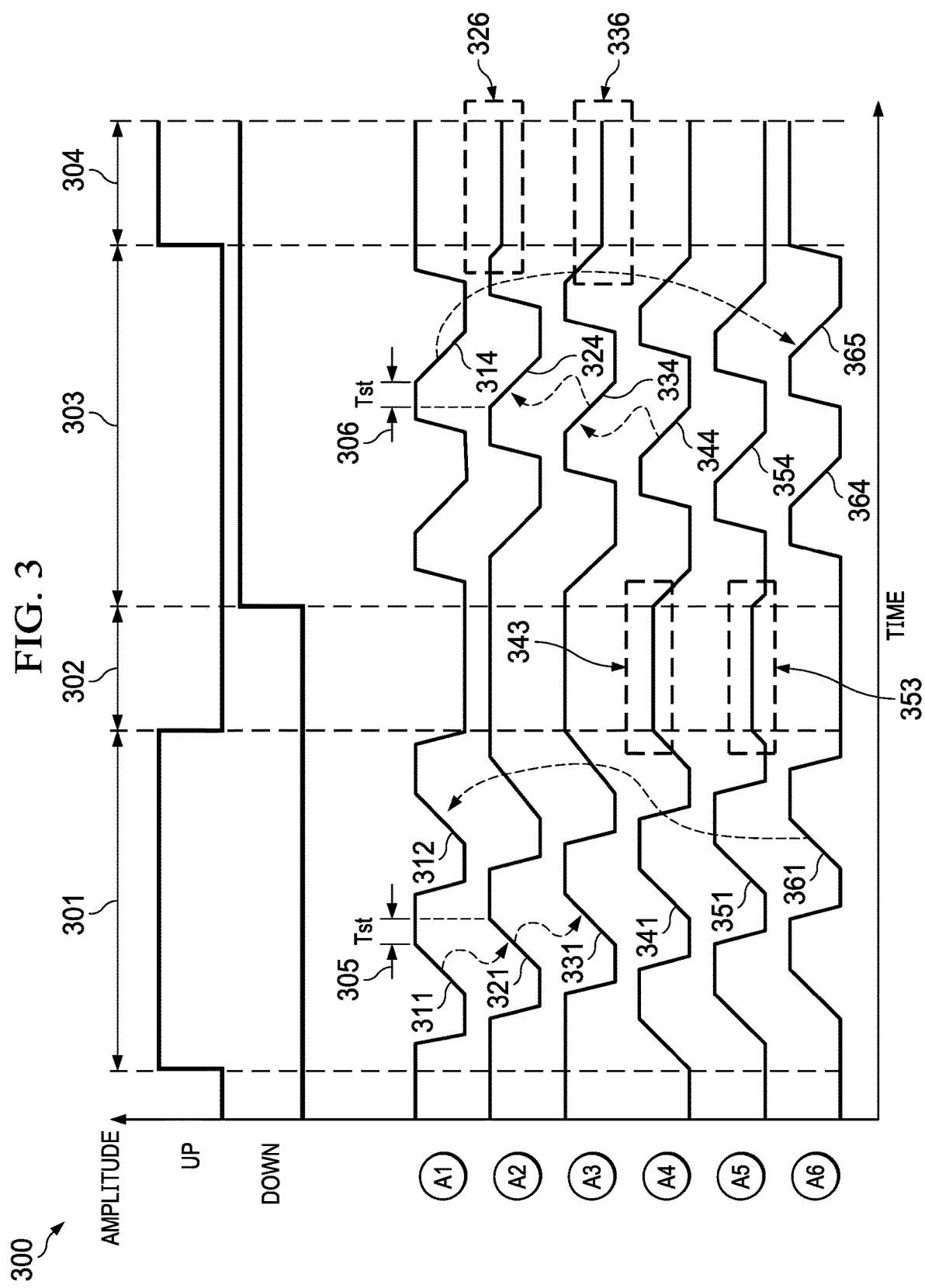
FIG. 3 is a waveform diagram of an example bidirectional operation of an example six-storage cell ring.

FIG. 3 is a waveform diagram of an example bidirectional operation of an example six-storage cell ring of an example TDC. The waveforms 300 are example waveforms that include the UP, DOWN, A1, A2, A3, A4, A5 and A6 signals. The waveforms 300 can be generated by an example six-storage cell ring that is configured similarly to the ring 110, which includes eight storage cells.

Generally described, the UP and DOWN signals can be generated by a phase-frequency detector (e.g., PFD 450, described hereinbelow). The PFD is configured to assert the UP signal in response to a phase of the feedback clock lagging a phase of a reference clock, and to assert the DOWN signal in response to a phase of the feedback clock leading a phase of the reference clock. The feedback clock and the reference clock are independently generated, which can lead to a phase of the feedback clock drifting forwards and backwards in time with respect to a phase of the reference clock. During period 301, the phase of the feedback clock lags the reference clock (e.g., so that the UP signal is asserted). During period 302, the phases of the feedback clock and the reference clock are substantially equal (e.g., substantially equal so that neither the DOWN signal nor the UP signal is asserted). During period 303, the phase of the feedback clock leads the reference clock (e.g., so that the DOWN signal is asserted). As an example, both the UP and DOWN signals are asserted during period 304 (e.g., in response to a period timing signal for indicating that a TDC timing sample is to be made). High-resolution (e.g., fine) timing information can be generated from analog values stored during the period 302 as signal quantities 343 and 353 and can be generated from analog values stored during the period 304 as signal quantities 326 and 336.

At the beginning of period 301, the DOWN signal is low (not asserted) and the UP signal is transitioned high (asserted), so that the UP signal transitions from a low voltage state to a high voltage state. Responsive to the assertion of the UP signal, the example six-storage cell ring is configured to oscillate in a CCW direction in which the A4 signal of a first storage cell is starts transitioning from a low value to a high value. Responsive to the A4 signal crossing the first threshold, the D4 signal is toggled high. In response to the D4 signal being toggled high, the signal S5 is toggled high, which in response drives the S(−2) input of the first storage cell (e.g., that includes the A1 signal output) to a logically high level. The A1 signal of the first storage cell is discharged to the low voltage state responsive to the signal received at the S(−2) input of the first storage cell. Other storage cells are configured to be similarly and successively (e.g., in a CCW direction) charged and discharged in sequence, so that a succession of rising ring edges can be propagated in a CCW loop around the storage cell ring (e.g., where rise of signal A4 triggers a rise of signal A5, which triggers a rise of signal A6, which triggers a rise of signal A1, which triggers a rise of signal A2, which triggers a rise of signal A3, which triggers a rise of signal A4, and so on).

Responsive to the L signal input of the first storage cell being driven high (e.g., by the sixth storage cell asserting a D6 signal on an output coupled to the L signal input, or by an initialization pulse generated responsive to the rising edge of the UP signal), the A1 signal rises with transition 311. The A1 signal rises responsive to the charge pump 220 of the first storage cell being activated responsive to the UP signal. As the A1 signal rises, the voltage of the input of the converter (e.g., thresholding converter 240) rises above a threshold, so that the D1 output (which is coupled to the L signal input of the second storage cell for generating A2) is toggled high (e.g., driven high). In response to the D1 output being driven high, the charge pump of the second storage cell (for driving the signal A2) is activated, so that (in response to the activated charge pump of the second storage cell) the signal A2 rises having a transition 321.

The transition 321 follows the transition 311 by the period TST (e.g., an integration-to-sampling-threshold time of the voltage rise of a charge pump capacitor—$C_{cp}$—such as capacitor 225). The rate of oscillation of the example six-storage cell ring can be determined responsive to the period TST of each of the storage cells. Each of the storage cells of the example six-storage cell ring are of similar design (and formed using the same processing and same substrate), so that the operational parameters (e.g., latency and drive strengths) of each component of the six storage cells is similar to respective components. For example, a charge pump 220 of a first storage cell can be configured have the same structural design as a charge pump 220 of the other charge pumps in the same storage cell ring.

The transition 331 is triggered responsive to the transition 321 (e.g., triggered in response to the assertion of signal S at an output of the second storage cell, which is coupled to the signal L input of the third storage cell). In a similar manner to the triggering of the transition 331 by transition 321, the signal A4 is subsequently transitioned high at transition 341 responsive the transition 331.

Similarly, the signal A5 is subsequently transitioned high at transition 351 responsive to the transition 341 of signal A4. Responsive to the transition 351 of the signal A5, the controller of the fifth storage cell asserts the S signal on an output of the fifth storage cell, which is coupled to the S(−2) input of the first storage cell. Responsive to the S(−2) input of the first storage cell being driven high, the discharge switch (e.g., switch 234) of the first storage cell is closed, so that the A1 signal is discharged to the low voltage state.

In a similar manner to the initiation of the transition 351 of signal A5, the signal A6 is subsequently transitioned high as transition 361 responsive to the transition 351 of signal A5. Responsive to the transition 361, the signal A1 rises as a transition 312.

Accordingly, a sequence of ring edges has completed a full loop (around the storage cell ring) over a time period extending from the beginning of the transition 311 to the beginning of the transition 312. The succession of rising ring edges continues to propagate until the end of period 301 (and until the start of period 302) at which time the UP signal is driven low. The negation of the UP signal isolates and maintains the charges stored by each of the charge pump capacitors $C_{cp}$ of each storage cell held at the instant of the negation of the UP signal.

In the particular example shown, the signal A4 includes a signal quantity 343 and the signal A5 includes a signal quantity 353 during the period 302. The signal quantity 343 indicates a time during which the fifth storage cell has been selected (e.g., during which the fifth storage cell has primarily been selected). An example operation of the ADC conversion of the signal quantity 343 is described hereinbelow with reference to FIG. 6.

At the start of period 303, the DOWN signal is asserted, and the UP signal remains low, so that the six-storage cell ring is configured to oscillate in a CW direction. Responsive to the assertion of the DOWN signal, the A6 signal of a sixth storage cell is initially charged to a high voltage state. The A6 signal of the sixth storage cell is charged to the high voltage state responsive to the S(+2) input of the second storage cell and/or an initialization pulse generated in response to the rising edge of the DOWN signal. Other storage cells are similarly and successively (e.g., in the CW direction) charged in sequence (e.g., so that a ring edge of falling edges can be propagated in a loop around the storage cell ring).

Responsive to the R signal input of the sixth storage cell being driven low (e.g., by the first storage cell asserting a low D1 signal on an output coupled to the R signal input, or by an initialization pulse generated responsive to the rising edge of the DOWN signal), the A6 signal falls with transition 364. The A6 signal falls responsive to the charge pump 220 of the first storage cell being activated responsive to the DOWN signal. As the A6 signal falls, the voltage of the input of the converter (e.g., thresholding converter 240) falls below a threshold, so that the output D6 (which is coupled to the R signal input of the fifth storage cell for generating A5) is toggled low (e.g., driven low). In response to the D6 output being driven low, the charge pump of the fifth storage cell (for driving the signal A5) is activated, so that (in response to the activated charge pump of the fifth storage cell) the signal A5 falls having a transition 354.

The transition 354 follows the transition 364 by the period TST. The rate of oscillation of the example six-storage cell ring in the CW and CCW are substantially equal (e.g., substantially equal within ten percent of each other). Each of the storage cells of the example six-storage cell ring are of similar design (and formed using the same processing and same substrate), so that the operational parameters (e.g., latency and drive strengths) of each component of the six storage cells is similar to respective components. For example, the current source 221 and the current source 222 are configured to generate substantially equal (e.g., substantially equal within ten percent of each other) currents $I_{cp}$.

The transition 344 of signal A4 is triggered responsive to the transition 354 (e.g., triggered in response to the assertion of signal S at an output of the fifth storage cell, which is coupled to the signal R input of the fourth storage cell), so that the signal A4 falls. In a similar manner to the triggering of the transition 344 by transition 354, the signal A3 is subsequently transitioned low at transition 334 responsive to the transition 344.

Similarly, the signal A2 is subsequently transitioned low responsive to the transition 334 of signal A3. Responsive to the transition 334 of the signal A3, the controller of the second storage cell asserts the S signal on an output of the second storage cell, which is coupled to the S(+2) input of the sixth storage cell. Responsive to the S(+2) input of the second storage cell being driven high, the precharge switch (e.g., switch 233) of the first storage cell is closed, so that the A1 signal is precharged to the high voltage state.

In a similar manner to the transitioning of the signal A2, the signal A1 is subsequently transitioned low as transition 314 responsive to the downward transition of signal A2. The start of the transition 314 follows the start of the transition 324 by the period TST 306. Responsive to the transition 314, the signal A6 falls as a transition 365.

Accordingly, a sequence of falling ring edges has completed a full loop (around the storage cell ring), where the full loop begins with the start of the transition 364 and ends at the start of the transition 365. The ring edges continue to propagate until the end of period 303 (and the start of period 304) at which time the UP signal is driven high. The assertion of the UP signal and the DOWN signal isolates and maintains (e.g., for sampling purposes) the charges stored by each of the charge pump capacitors $C_{cp}$ of each storage cell held at the instant of the negation of the UP signal.

In the particular example shown, the signal A2 includes a signal quantity 326 and the signal A3 includes a signal quantity 336 during the period 304. The signal quantity 336 indicates a time during which the third storage cell has been selected (e.g., during which the third storage cell has primarily been selected). The signal quantity 326 is converted to a digital value by the analog quantifier 140, which indicates a fine resolution time measurement (e.g., with respect to a value generated by the loop counter 130).

Figure 4:
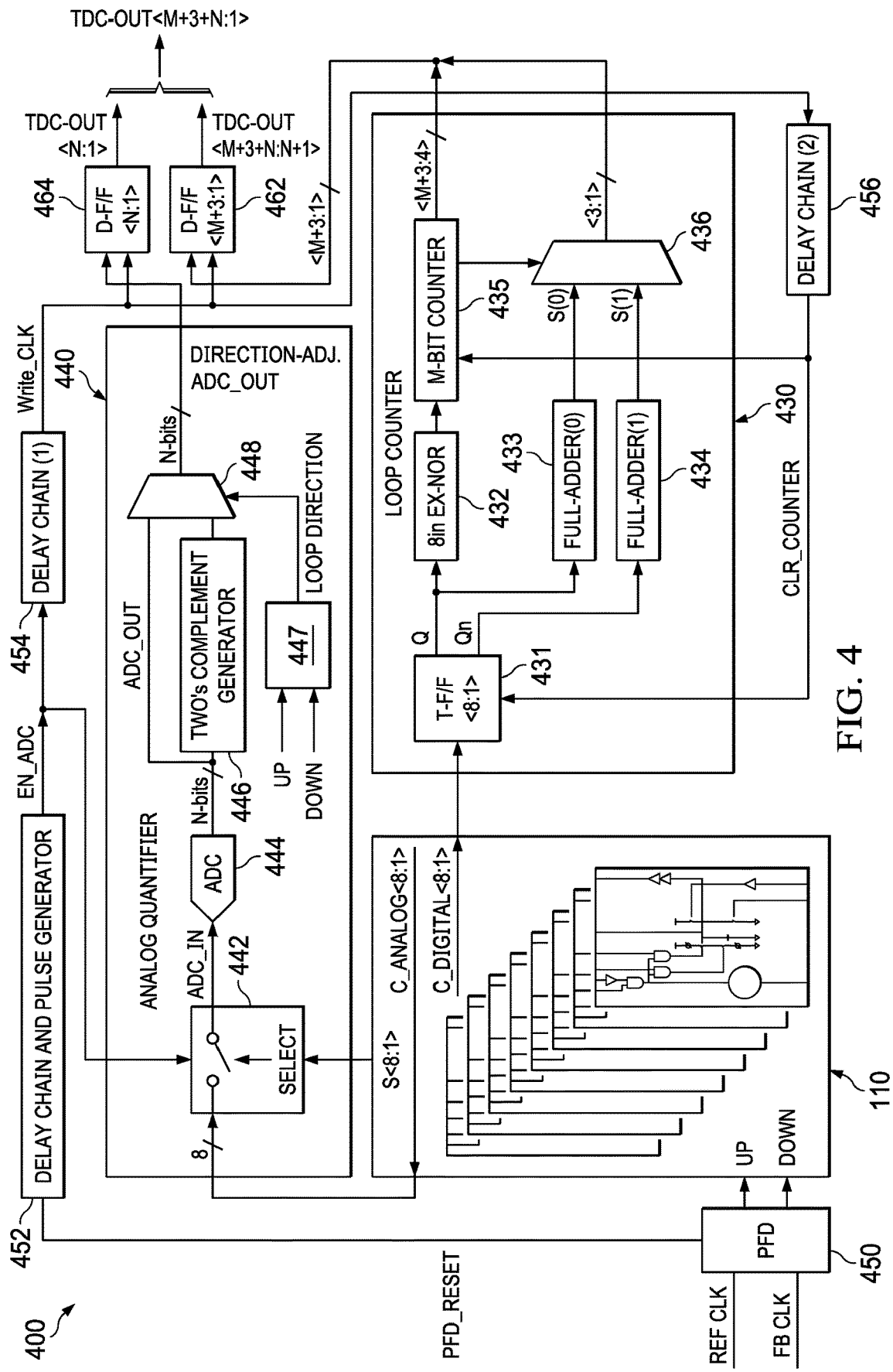
FIG. 4 is a system diagram showing an example bidirectional storage cell ring-based time-to-digital converter (TDC) coupled to a phase-frequency detector (PFD).

FIG. 4 is a system diagram showing an example bidirectional storage cell ring-based time-to-digital converter (TDC) coupled to a phase-frequency detector (PFD). The system 400 is an example system configured to measure a phase difference between a reference clock and a feedback clock, where the phase/frequency of the feedback clock can be adjusted in response to the phase measurement (e.g., time measurement). For example, a TDC of system 400 is an example TDC that includes a ring 110, an analog quantifier 440 (such as the analog quantifier 140) and a loop counter 430 (such as the loop counter 130). The TDC can be configured to measure a phase difference (e.g., in time) between a reference clock signal and a feedback clock signal that is generated (e.g., by a digitally controlled oscillator) responsive to the phase difference measurement. Generally described, the TDC is configured to receive (e.g., at a timing input of the ring 110) an indication from the PFD (e.g., PFD 450) of a time difference (e.g., a phase difference), so that the TDC can measure the time difference responsive to the indication received from the PFD 450.

In the example, the PFD 450 is a detector that includes a reference clock (REF CLK) input, a feedback clock (FB CLK) input, a PFD reset signal output, and a detector output that includes an UP signal output and a DOWN signal output. The detector output is coupled to a timing input of the ring 110, which includes the UP signal input and the DOWN signal output. The PFD 450 is configured to compare the input phase of the reference clock against the phase of the feedback clock. The PFD 450 is configured to assert the UP signal in response to a phase of the feedback clock lagging a phase of the reference clock and to assert the DOWN signal in response to a phase of the feedback clock leading a phase of the reference clock. In response to an assertion of the UP and DOWN signals, the ring 110 is configured to generate at least one analog signal for indicating a first measurement of a phase comparison and is configured to generate at least one binary signal for indicating a second measurement of a phase comparison (e.g., where the second measurement has less voltage resolution than the voltage resolution of the first measurement). In at least one example, the PFD 450 includes a timing output (e.g., the UP signal output and the DOWN signal output) that is adapted to generate an indication of a start time and an indication of a stop time.

The PFD reset signal can be asserted in response to (for example) a periodic timing signal for indicating that a TDC timing sample is to be made. The higher the speed of the TDC, the higher the frequency of measuring the timing samples (e.g., so that the frequency fidelity of the feedback clock to the reference clock can be increased). The assertion of the UP and DOWN signals at the same time (e.g., so that a portion of the UP signal waveform is high at the same time a portion of the DOWN signal is high) can be responsive to the PFD reset signal and/or the periodic timing signal. The periodic timing signal can be generated responsive to a clock input of the PFD 450 (e.g., the reference clock).

The PFD reset output is coupled to an input of the delay chain and pulse generator 452. The delay chain and pulse generator 452 includes an output at which the enable ADC (EN_ADC) signal is generated (e.g., generated by the delay chain and pulse generator 452). The SAMPLE_ADC waveform 730 (described hereinbelow with respect to FIG. 7) is an example waveform of the signal EN_ADC. In at least one example, the EN_ADC signal is a pulse generated in response to a periodic timing signal, where a first edge of the pulse is delayed with respect to a value or a change in value of the periodic timing signal, and where a second edge of the pulse is delayed with respect to the first edge of the pulse.

The EN_ADC signal output of the delay chain and pulse generator 452 is coupled to an EN_ADC signal input of the selector 442 of the analog quantifier 440 and to an EN_ADC signal input of the delay chain 454. In an example, the analog quantifier 440 is configured to generate a conversion value at a conversion output responsive to a selected one of the respective integrated voltages, wherein the selected one of the respective integrated voltages is selected in response to at least one of the respective select signals, and wherein the conversion value indicates a first portion of a time measurement of a time duration that extends from the start time to the stop time.

The selector 442 is an example selector described hereinbelow with respect to FIG. 6. The selector 442 is configured to sample (e.g., as in sampling with a sample-and-hold analog circuit) a voltage developed in response to an integration of charge of a capacitor of a selected storage cell. The selector 442 includes select inputs that are coupled to respective digital outputs (e.g., selection bus S<8:1>) of the storage cells. A particular storage cell can be selected responsive to bit values (e.g., pairs of adjacent bit values) of the selection bus.

The sample-and-hold output of the selector 442 is coupled to the ADC_IN signal input of the ADC 444. The ADC 444 can include a resistive ladder and comparator network, so that the ADC 444 is configured to output (at a conversion output) a digital value (e.g., as an N-bit value) for indicating an analog voltage generated responsive to the selector 442 (e.g., where the output value of the ADC 444 can be generated without requiring clocking of the ADC 444).

The analog quantifier 440 further includes a two's complement generator 446, a loop direction detector 447, and a multiplexer 448. The two's complement generator 446 includes an input that is coupled to the output of the ADC 444 and includes an output at which the two's complement generator 446 is configured to generate a two's complement value responsive to the value output by the ADC 444. In an example, the analog quantifier 440 is configured to output a two's complement number responsive to a selection of a first direction or second direction of ring oscillation.

The loop direction detector 447 includes a first input (e.g., a D input) coupled to the UP output of the PFD 450 and includes a second input (e.g., a rising-edge triggered clock input) coupled to the DOWN output of the PFD 450. The loop direction detector 447 is configured to generate loop direction signal responsive to the UP and DOWN signals. In an example, the loop direction signal is low (logic zero) responsive to a low value of the UP signal, and the loop direction signal is high (logic one) responsive to a low-to-high transition of the DOWN signal.

The multiplexer 448 includes a first input coupled to the output of the ADC 444 and includes a second input coupled to the output of the two's complement generator 446. The multiplexer 448 is configured to generate at an output of the multiplexer a direction-adjusted ADC output (DIRECTION-ADJ. ADC_OUT) signal. The direction-adjusted ADC output signal includes (responsive to the loop direction signal) the ADC_OUT value when the loop direction signal is low, and the direction-adjusted ADC output signal includes the generated two's complement value (e.g., of the ADC_OUT signal) when the loop direction signal is high.

The delay chain 454 is configured to generate (e.g., in response to the signal EN_ADC) a write clock (Write_CLK) signal at a Write_CLK signal output of the delay chain 454. The Write_CLK waveform 740 (described hereinbelow with respect to FIG. 7) is an example waveform of the signal Write_CLK. In at least one example, the Write_CLK signal is a pulse generated in response to the signal EN_ADC, where a first edge of the pulse is delayed with respect to a value or a change in value of the signal EN_ADC, and where a second edge of the pulse is delayed with respect to the first edge of the pulse. The Write_CLK signal output of the delay chain 454 is coupled to the respective Write_CLK signal inputs (e.g., clock input) of the D-type flipflops (D-F/F, or "latches") 462 and 464. The Write_CLK signal output of the delay chain 454 is further coupled to the Write_CLK signal input of the delay chain 456.

The latch 464 includes an n-bit ADC result input that is coupled to the output of the ADC 444. The latch 464 is configured to latch the n-bit ADC result in response to the Write_CLK signal. The latch 464 includes an n-bit TDC-OUT<N:1> output at which the latched n-bit ADC result is asserted. The TDC-OUT<N:1> portion of the TDC-OUT<M+3+N:1> bus includes the less-significant bits (e.g., as determined by an analog-to-digital conversion) of the time period being measured.

The latch 462 includes an "M+3"-bit-long loop counter 430 result input that is coupled to the "M+3"-bit loop counter output. The "M+3"-bit output value is a fixed-point number for indicating an integer number of completed oscillation loops (indicated by the more-significant "M"-bits, where "M" is a number of bits for indicating a maximum number of loops that can be counted) and for indicating a fraction (e.g., a less-than-unity fraction) of a not-completed oscillation loop (indicated by the less-significant "+3" bits, where "+3" is the binary exponent of the number of storage cells in the ring 110). The latch 462 is configured to latch the "M+3"-bit loop counter result in response to the Write_CLK signal. The latch 462 includes an "M+3"-bit TDC-OUT<M+3+N:N+1> output at which the latched "M+3"-bit-long loop counter result is asserted. The TDC-OUT<N:1> portion of the TDC-OUT<M+3+N:1> bus includes the less-significant bits (e.g., as determined by an analog-to-digital conversion) of the time period being measured.

The delay chain 456 is configured to generate (e.g., in response to the signal Write_CLK) a clear counter (CLR_COUNTER) signal at a CLR_COUNTER signal output of the delay chain 456. The CLR_COUNTER waveform 750 (described hereinbelow with respect to FIG. 7) is an example waveform of the signal CLR_COUNTER. In at least one example, the CLR_COUNTER signal is a pulse generated in response to the signal Write_CLK, where a first edge of the pulse is delayed with respect to a value or a change in value of the signal Write_CLK, and where a second edge of the pulse is delayed with respect to the first edge of the pulse. The CLR_COUNTER signal output of the delay chain 454 is coupled to the respective CLR_COUNTER signal inputs of the toggle-type flipflop (T-F/F, or "latch") 431 and the M-bit counter 435.

The loop counter 430 includes the latch 431, the M-bit counter 435, an EX-NOR gate 432, a full-adder 433, a full-adder 434, and a multiplexer 436. The input of the latch 431 is a digital input that is coupled to a respective digital output of each storage cell in the ring 110. In an example operation, the latch 431 and the M-bit counter 435 are initialized (e.g., cleared) responsive to the CLR_COUNTER signal, which is asserted in response to a completion of a previous time measurement (e.g., which is generated responsive to the combination of digital and analog quantities generated respectively by the loop counter 130 and the analog quantifier 140). An example operation of the loop counter 430 is described hereinbelow with reference to FIGS. 5A and 5B.

In an example, an analog quantifier (e.g., 440) has analog inputs (C_ANALOG<8:1>) and digital inputs (S<8:1>), wherein each of the analog inputs is coupled to a respective one of the respective capacitors (e.g., each capacitor 225 of storage cells 111-118 is individually coupled to the analog quantifier), and wherein each of the digital inputs is coupled to a respective one of the selection outputs of the respective selection circuits (e.g., the output Sx of each of the storage cells 111-118 is individually coupled to the analog quantifier). The output of the analog quantifier (e.g., 440) is a conversion value that comprises less-significant bits of the measurement for indicating the time duration that extends from the start time to the stop time.

In an example, a loop counter (e.g., 430) has inputs (C_DIGITAL<8:1>), wherein each input is coupled to a respective one of the outputs of the respective thresholding converters (e.g., each respective input of the series of flip-flops of latch 431 is individually coupled to an output of the thresholding converter 240 of each of the storage cells 111-118). In an example, the loop counter (e.g., 430) is configured to generate a loop count value responsive to changes of values of at least some of the respective thresholded signals, where the loop count value indicates a second portion of the time measurement of the time duration that extends from the start time to the stop time. In an example, the loop count value comprises more-significant bits of a measurement for indicating the time duration that extends from the start time to the stop time. In an example, the loop count value comprises a number of completed loop oscillations of the ring that are counted between the start time and the stop time.

Figure 5A:
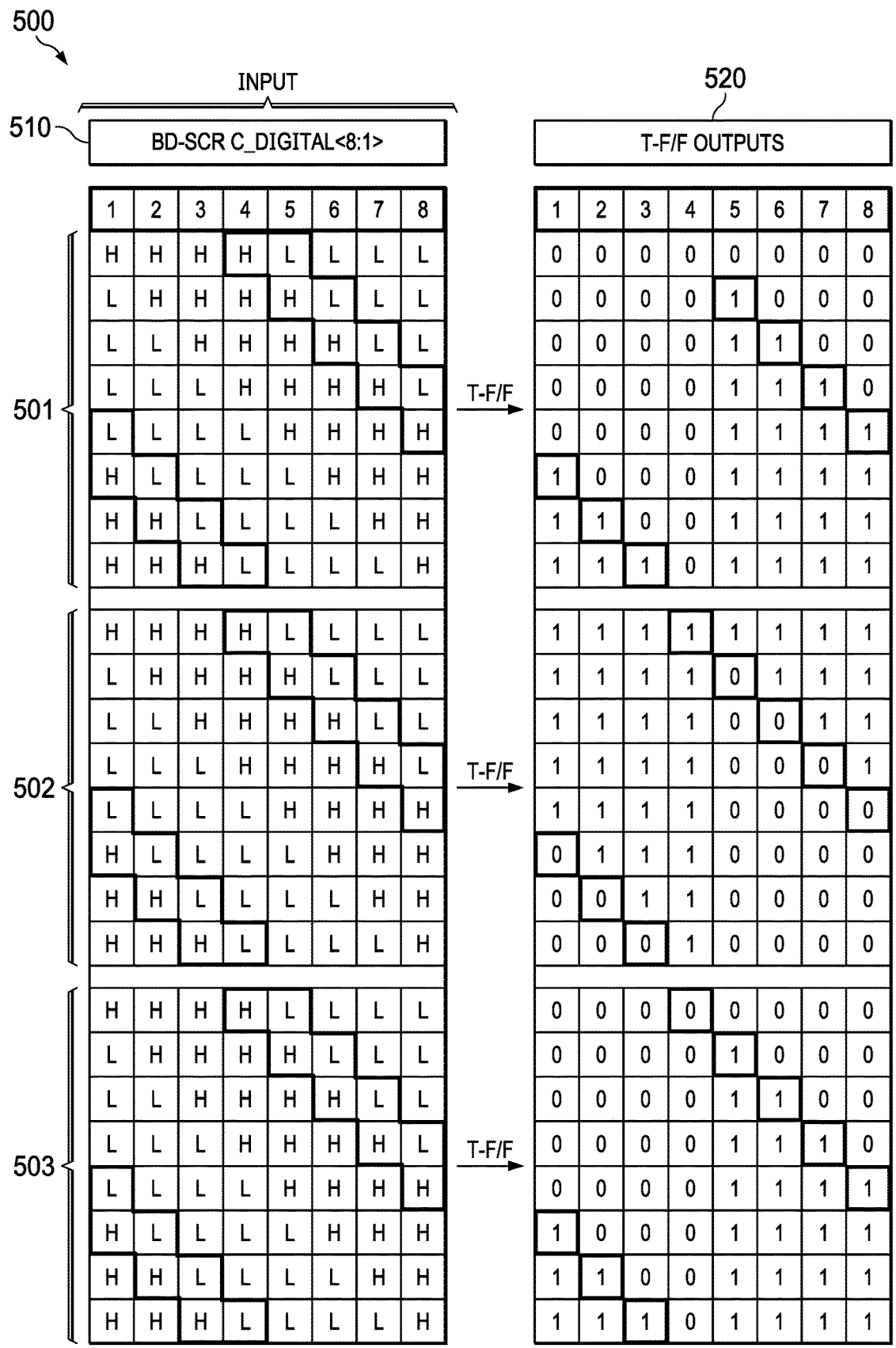
FIG. 5A and FIG. 5B are example diagrams that include columns of example values generated responsive to the operation of the loop counter.
Figure 5B:
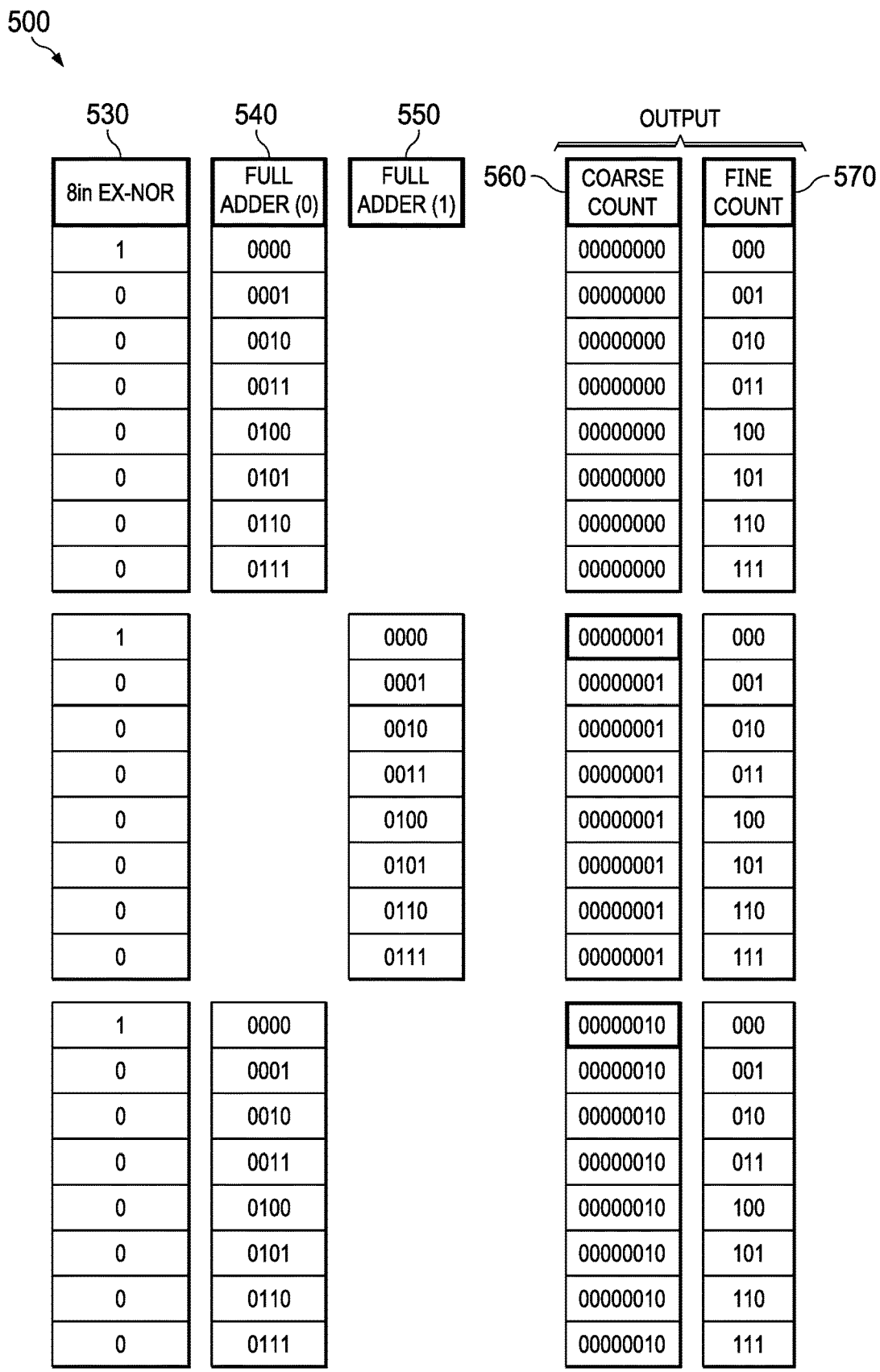

FIG. 5A and FIG. 5B are example diagrams that include columns of example values generated responsive to the operation of the loop counter of FIG. 4. Diagram 500 is an example diagram that includes a series of columns in which the row at the head of a respective column includes initial starting values (e.g., initialized in response to the CLR_COUNTER signal). Successive rows in each column show how certain values in a row can change over time.

Generally, each row indicates values that exist at a same time (e.g., for each row that extends through the columns 510, column 520, column 530, column, 540, column 550, column 560 and column 570). The first group 501 of eight rows in a column shows a first loop of an oscillation in a storage cell ring (e.g., ring 110), where each row includes values generated in response to a ring edge traversing from a first storage cell to an adjacent storage cell. The second group 502 of eight rows in a column shows a second loop of an oscillation in a storage cell ring, and the third group 503 of eight rows in a column shows a third loop of an oscillation in a storage cell ring. An example operation of the loop counter 430 is described hereinbelow with reference to FIG. 4, FIG. 5A, and FIG. 5B.

The latch 431 includes a digital bus input coupled to the digital bus D<8:1>, which is generated at the C_DIGITAL<8:1> outputs of the ring 110. The latch 431 also includes a set of positive-logic outputs Q (e.g., so that each Q output is coupled from a respective output of the eight storage cells) and a set of negative-logic outputs Qn (e.g., so that each Qn output is coupled from a respective output of the eight storage cells. The outputs Q of the latch 431 are each coupled to a respective input of the eight-bit inputs of the EX-NOR gate 432 and to a respective input of the eight-bit input of the full-adder 433. The outputs Qn of the latch 431 are coupled to the eight-bit input of the full-adder 434.

The latch 431 is configured to toggle an output state of each output (e.g. Q or Qn) responsive to a positive voltage transition of a change of a respective bit at the digital bus input of latch 431. For example, the values of the digital bus inputs of latch 431 are shown in column 510 (of FIG. 5A), and the response of the latch 431 to the values of the digital bus inputs are shown in column 520. In the example, column 520 shows a response of the latch 431 to the values of column 510, which include values showing a counterclockwise direction of oscillations within a storage cell loop.

The EX-NOR gate 432 includes an output, which is coupled to an input of the M-bit counter 435. The EX-NOR gate 432 is configured to generate (at the output of the EX-NOR gate 432) an indication (e.g., see column 530) of a completed loop of oscillation ring edges in a storage cell loop. For example, the EX-NOR gate 432 can assert the indication of a completed loop responsive to the C_DIGITAL<8:1> outputs of the ring 110 and/or the Q outputs of the EX-NOR gate 432. As shown in column 520 and column 530, the EX-NOR gate 432 is configured to generate an initial indication (e.g., a logical 1) in response to all bits of the latch 431 outputs being a first logic state (e.g., logical 1). In an example, EX-NOR gate 432 can assert the indication of a completed loop responsive to each of the respective thresholded signal C_DIGITAL<8:1> outputs having a same value (e.g., where each respective thresholded signal concurrently has a same value as the other respective thresholded signals). The initial indication can be effectively ignored, for example, by presetting the every counting bit of the M-bit counter 435 to a logical 1 (e.g., so that the first indication toggles the M-bit counter 435 from the preset value to an output value of 0 (zero), which indicates that no complete loop has occurred). In an example, the loop count value (e.g., see LOOP COUNTER 980 of FIG. 9) comprises a number of completed loop oscillations of the ring, and the number of completed loop oscillations is incremented responsive to a logical state in which each respective thresholded signal concurrently has a same value as the other respective thresholded signals.

The EX-NOR gate 432 is configured to generate a first indication (e.g., a logical 1) of a first complete loop in response to all bits of the latch 431 outputs being a second logic state (e.g., logical 0) that is different from the first logic state. The EX-NOR gate 432 is configured to generate a third indication (e.g., a logical 1) of a second complete loop in response to all bits of the latch 431 outputs being a first logic state (e.g., logical 1).

For example, determining the completion of a loop as determined by the EX-NOR (e.g., the equivalence logic function, where all input bits have the same logic state) facilitates increasing the oscillation speed of the example storage cell ring because the storage state of the storage cell is toggled only once each loop (e.g., so that the storage cells need not traverse two logic states during a single loop of an oscillation of a storage cell ring. In the examples shown, the first loop is completed responsive to a ring of logical zero-to-one transitions, and the second loop is completed responsive to a ring of logical one-to-zero transitions.

In addition to generating an indication of a number of completed loop oscillation, the loop counter 430 is configured to determine a number of cells through which a partial loop has traversed (e.g., the number of cells traversed by a ring edge after completing a full loop at the time the loop oscillation is stopped). In an example, the loop counter (e.g., the loop counter 430) comprises a first partial loop indicator generator (e.g., the full-adder 433), a second partial loop indicator generator (e.g., the full-adder 434), and a multiplexer (e.g., multiplexer 436) that has a first input coupled to an output of the first partial loop indicator generator (e.g., the full-adder 433) and has a second input coupled to the output of the second partial loop indicator generator (e.g., the full-adder 434), wherein the multiplexer (e.g., multiplexer 436) is arranged to select one of the first partial loop indicator generator and the second partial loop indicator generator responsive to a logic state of a less-significant bit (e.g., the least-significant bit of the output of the M-bit counter 435) of the number of completed loop oscillations.

In an example, the propagation ring edge can include rising-edge transitions (e.g., from zero-to-one) and can include falling-edge transitions (e.g., from one-to-zero). A first partial loop indicator generator (e.g., the full-adder 433, where the full-adder 433 output values are shown in column 540) is configured to indicate (e.g., count) at an output the number of storage cells through which the rising-transition ring edge has propagated. When the propagation ring edge includes falling-edge transitions (e.g., from zero-to-one), a second partial loop indicator generator (e.g., the full-adder 434, where the full-adder 434 output values are shown in column 550) is configured to indicate (e.g., count) the number of storage cells through which the falling-transition ring edge has propagated. In various examples, a partial loop indicator generator can be a thermometer-type progress indicator.

Because (for example) the full-adder 434 indicates (e.g., as a 3-bit value) the number of number of storage cells through which the rising-transition ring edge has propagated (e.g., has propagated after a complete loop or a reset condition), and because (for example) the full-adder 434 indicates (e.g., as a 3-bit value) the number of storage cells through which the falling-transition ring edge has propagated (e.g., has propagated after a complete loop or a reset condition), a multiplexer 436 (e.g., MUX) is arranged to alternate the selection of the partial loop indicator at the completion of a full loop. The output (e.g., 3-bit output) of the full-adder 433 is coupled to the S(0) input (e.g., a first input) of the multiplexer 436, the output (e.g., 3-bit output) of the full-adder 434 is coupled to the S(1) input (e.g., a second input), and a less-significant bit (e.g., least-significant bit) of the M-bit counter 435 (e.g., which indicates whether an odd or even number of completed loop oscillations has been counted by the M-bit counter 435) is coupled to the select input of the multiplexer 436.

In an example, the multiplexer 436 is arranged to select one of the first partial loop indicator generator (e.g., the full-adder 433) and the second partial loop indicator generator (e.g., the full-adder 434) responsive to a logic state of a bit of the number of completed loop oscillations (e.g., where the bit indicates an odd or an even number of the completed loop oscillations). In an example, the number of storage ring (e.g., ring 110) number of storage cells (e.g., any chain of storage cells 111-118) that toggle their respective thresholded signals during the less-than-unity fraction of the oscillation loop that is propagating at the stop time (e.g., at the time the ring stops oscillating), toggle their respective thresholded signals by including rising transitions during a first complete oscillation loop and by including falling transitions during a second oscillation loop that successively follows the first complete oscillation loop. In an example, the loop count value comprises a less-than-unity fraction of an oscillation loop that is propagating at the stop time, where the less-than-unity fraction is determined responsive to a number of storage cells (e.g., any chain of storage cells 111-118) that toggle their respective thresholded signals during the less-than-unity fraction of the oscillation loop that is propagating at the stop time.

The multiplexer 436 is configured to generate at the multiplexer 436 output (e.g., at the MUX output<3:1>) a partial loop indication responsive to an indication of a number of completed loop oscillations. The M-bit counter 435 output<M+3:4> (e.g., the eight most-significant bits of the "M+3"-bit-long loop counter 430 result) is shown as the "Coarse Count" values of column 560, and the multiplexer 436 output is (e.g., the least-significant bits of the "M+3"-bit-long loop counter 430 result) is shown as the "Fine Count" values of column 570. The "Coarse Count" of column 560 is an indication of the number completed loop oscillations, and the "Fine Count of column 570 is an indication of a number of storage cells of a storage cell ring through which a ring edge has propagated.

Figure 6:
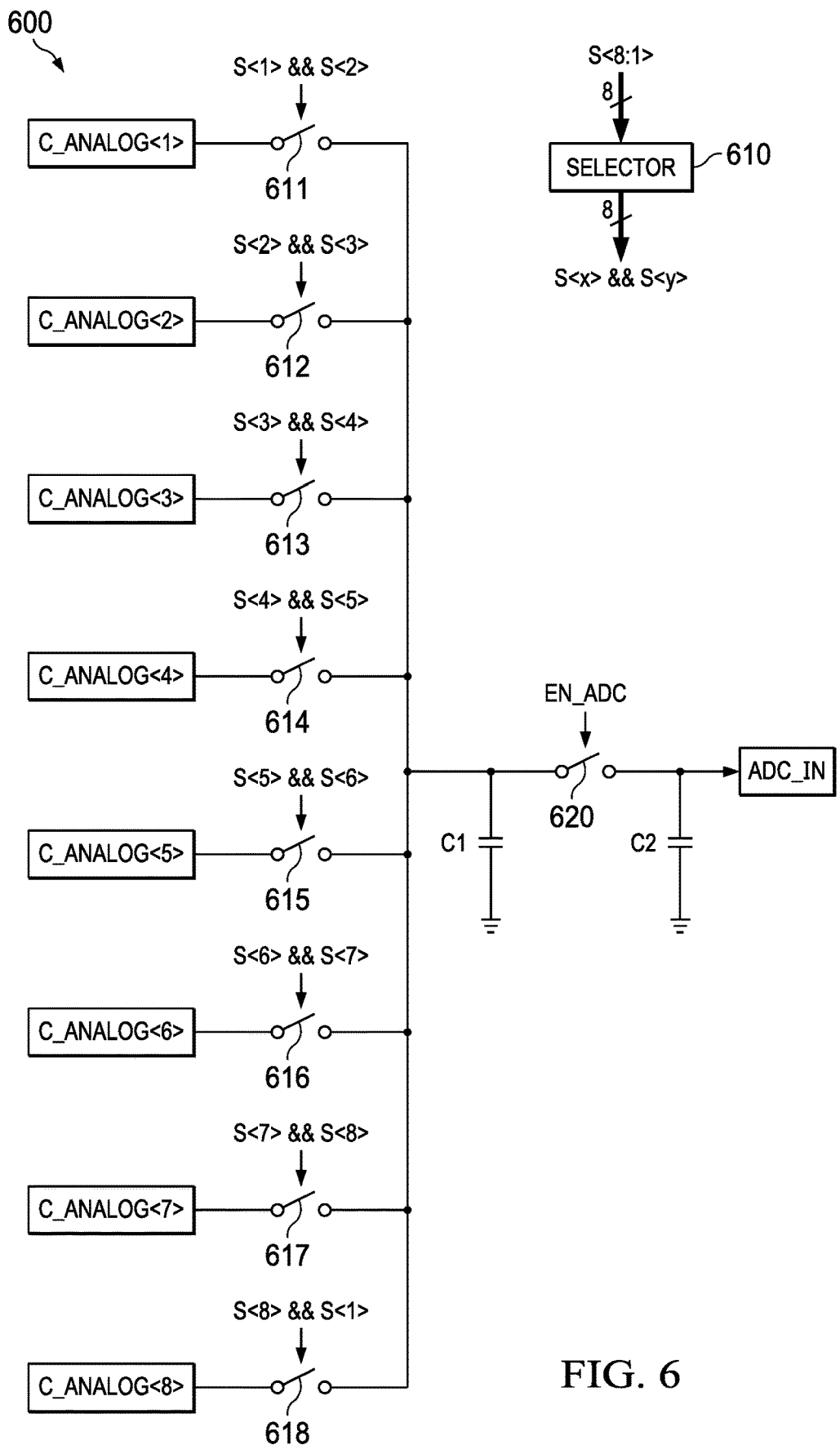
FIG. 6 is a schematic diagram of an example analog sampling circuit of an example bidirectional storage cell ring-based time-to-digital converter (TDC).

FIG. 6 is a schematic diagram of an example analog sampling circuit of an example bidirectional storage cell ring-based time-to-digital converter (TDC). The sampling circuit 600 is an example sampling circuit that generally includes selector 610 logic circuitry, switches 611, 612, 613, 614, 615, 616, 617, 618 and 620, and capacitors C1 and C2. The switches can be low-resistive analog transmission gates, for example. The switches can be arranged as an analog multiplexor having eight inputs and one ouput The selector 610 is a logic circuit that includes an input S<8:1>, which is coupled (e.g., bit-wise coupled) to the status bus S<8:1> at the respective digital outputs of the storage cells of the ring 110, for example. The selector 610 logic circuitry is configured to generate a selection signal for sampling a stored charge of a storage cell, where selection signal for a switch is generated responsive to pairs of signals (e.g., S<x> and S<y>, where "x" and "y" are numbers of logically adjacent storage cells) that are conveyed by the digital bus D<8:1>. In an example, "y" is equal to "x+1."

For example, the switch 611 includes an input coupled to the C_ANALOG<1> output, a control input coupled to a respective output of the selector 610 logic circuitry, and an output coupled to a high-side node of the capacitor C1. The switch 611 is configured to close when S<1> and S<2> are both high. The closing of switch 611 transfers charge to the capacitor C1, where the transferred charge is stored after the switch 611 is opened.

In the example, the switch 612 includes an input coupled to the C_ANALOG<2> output, a control input coupled to a respective output of the selector 610 logic circuitry, and an output coupled to a high-side node of the capacitor C1. The switch 612 is configured to close when S<2> and S<3> are both high. The closing of switch 612 transfers charge to the capacitor C1, where the transferred charge is stored after the switch 612 is opened.

In the example, the switch 613 includes an input coupled to the C_ANALOG<3> output, a control input coupled to a respective output of the selector 610 logic circuitry, and an output coupled to a high-side node of the capacitor C1. The switch 613 is configured to close when S<3> and S<4> are both high. The closing of switch 613 transfers charge to the capacitor C1, where the transferred charge is stored after the switch 613 is opened.

In the example, the switch 614 includes an input coupled to the C_ANALOG<4> output, a control input coupled to a respective output of the selector 610 logic circuitry, and an output coupled to a high-side node of the capacitor C1. The switch 614 is configured to close when S<4> and S<5> are both high. The closing of switch 614 transfers charge to the capacitor C1, where the transferred charge is stored after the switch 614 is opened.

In the example, the switch 615 includes an input coupled to the C_ANALOG<5> output, a control input coupled to a respective output of the selector 610 logic circuitry, and an output coupled to a high-side node of the capacitor C1. The switch 615 is configured to close when S<5> and S<6> are both high. The closing of switch 615 transfers charge to the capacitor C1, where the transferred charge is stored after the switch 615 is opened.

In the example, the switch 616 includes an input coupled to the C_ANALOG<6> output, a control input coupled to a respective output of the selector 610 logic circuitry, and an output coupled to a high-side node of the capacitor C1. The switch 616 is configured to close when S<6> and S<7> are both high. The closing of switch 616 transfers charge to the capacitor C1, where the transferred charge is stored after the switch 616 is opened.

In the example, the switch 617 includes an input coupled to the C_ANALOG<7> output, a control input coupled to a respective output of the selector 610 logic circuitry, and an output coupled to a high-side node of the capacitor C1. The switch 617 is configured to close when S<7> and S<8> are both high. The closing of switch 617 transfers charge to the capacitor C1, where the transferred charge is stored after the switch 617 is opened.

In the example, the switch 618 includes an input coupled to the C_ANALOG<8> output, a control input coupled to a respective output of the selector 610 logic circuitry, and an output coupled to a high-side node of the capacitor C1. The switch 618 is configured to close when S<8> and S<1> are both high. The closing of switch 618 transfers charge to the capacitor C1, where the transferred charge is stored after the switch 618 is opened.

The switch 620 has an input coupled to the high-side node of the capacitor C1 and an output coupled to a high-side node of the capacitor C2 and the analog input (ADC_IN) of the ADC (e.g., ADC 444). The switch 620 is configured to transfer the stored charge from the capacitor C1 to the capacitor C2 (e.g., for sampling by the ADC 444) responsive to the EN_ADC (described hereinbelow with respect to FIG. 7. As described hereinabove, the ADC 444 is configured to generate a digital value (e.g., TDC-OUT<N:1>, which indicates an intercell partial propagation time.

An example timing resolution for the storage cell rings described herein can be determined in response to the period TST (e.g., period TST 305). Assuming a high-side power rail of Vdd=1 volt; a charge pump capacitor $C_{cp}$=2 picofarads; charge pump currents $I_{cp}$ of 4 milliamps; and the period TST having the relationship:

$$TST = \frac{Vdd}{2} \times \frac{Ccp}{Icp} \quad (1)$$

the period TST is $2.5 \times 10^{-10}$ seconds. Assuming an ADC output of 8 bits, the number of ADC steps (ADC_steps) is 256. The resolution of the TDC (Tdc_Resolution) can be determined in response to the period TST and the number of ADC_steps:

$$\text{Tdc\_Resolution} = \frac{TST}{ADC\_steps} \quad (2)$$

so that the Tdc-Resolution is $9.766 \times 10^{-13}$ seconds (which can be rounded up to 1 picosecond).

Figure 7:
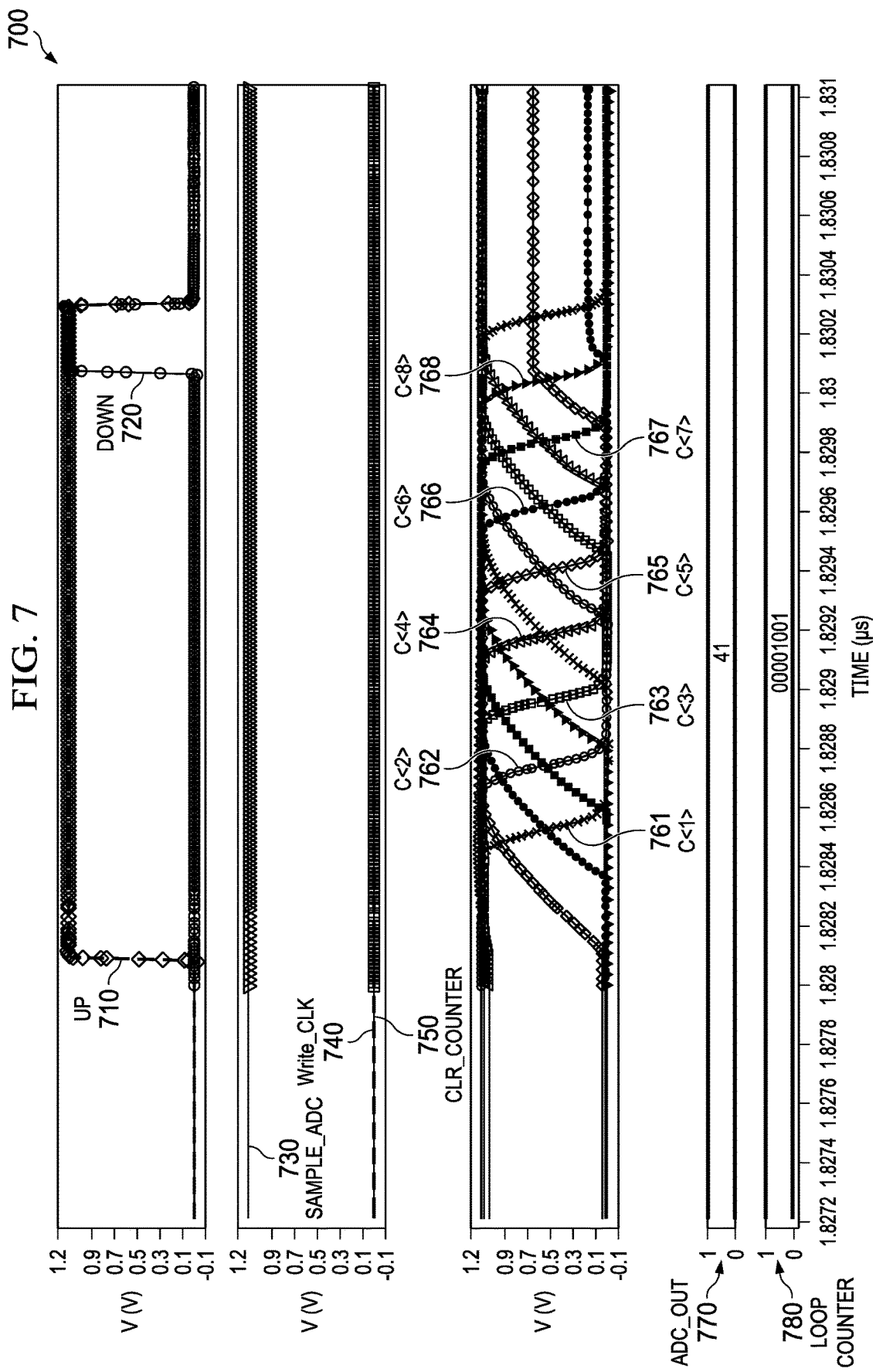
FIG. 7 is a waveform diagram that includes waveforms of an example simulation of the example system of FIG. 4.

FIG. 7 is a waveform diagram that includes waveforms of an example simulation of the example system of FIG. 4. The diagram 700 includes waveforms of an example simulation using parameters as described hereinabove as well as parameters of a target 65-nanometer process selected for manufacture of circuits including techniques for storage cell rings described herein. Example waveforms of the diagram 700 include the signals UP 710, DOWN 720, SAMPLE_ADC 730, Write_CLK 740, CLR_COUNTER 750, C<1> 761, C<2> 762, C<3> 763, C<4> 764, C<5> 765, C<6> 766, C<7> 767, C<8> 768, ADC_OUT 770, and LOOP COUNTER 780.

In the example simulation, a reference clock (e.g., see FIG. 4) is chosen to lead the feedback clock by a selected phase delay (e.g., SPD, as indicated by the difference in time of the assertion of the signal UP 710 and the assertion of the signal DOWN 720. The signal UP is asserted (e.g., as a low-to-high transition) by the PFD (e.g., PFD 450) responsive to a phase of the reference clock and the signal DOWN 720 is asserted (e.g., as a low-to-high transition) by the PFD responsive to a phase difference of the DOWN signal relative to the phase of the signal UP 710.

A reset pulse (e.g., the signal PFD_RESET generated by PFD 450 of FIG. 4) is generated by the PFD, which is indicated in the simulation as a logical AND function of the signals UP 710 and DOWN 720. The SAMPLE_ADC 730 (e.g., the EN_ADC signal generated by the delay chain and pulse generator 452) is generated in response to the reset pulse (e.g., PFD_RESET), the signal Write_CLK 740 is generated in response to the signal SAMPLE_ADC 730, and the signal CLR_COUNTER 750 is generated in response to the signal Write_CLK 740.

Figure 8:
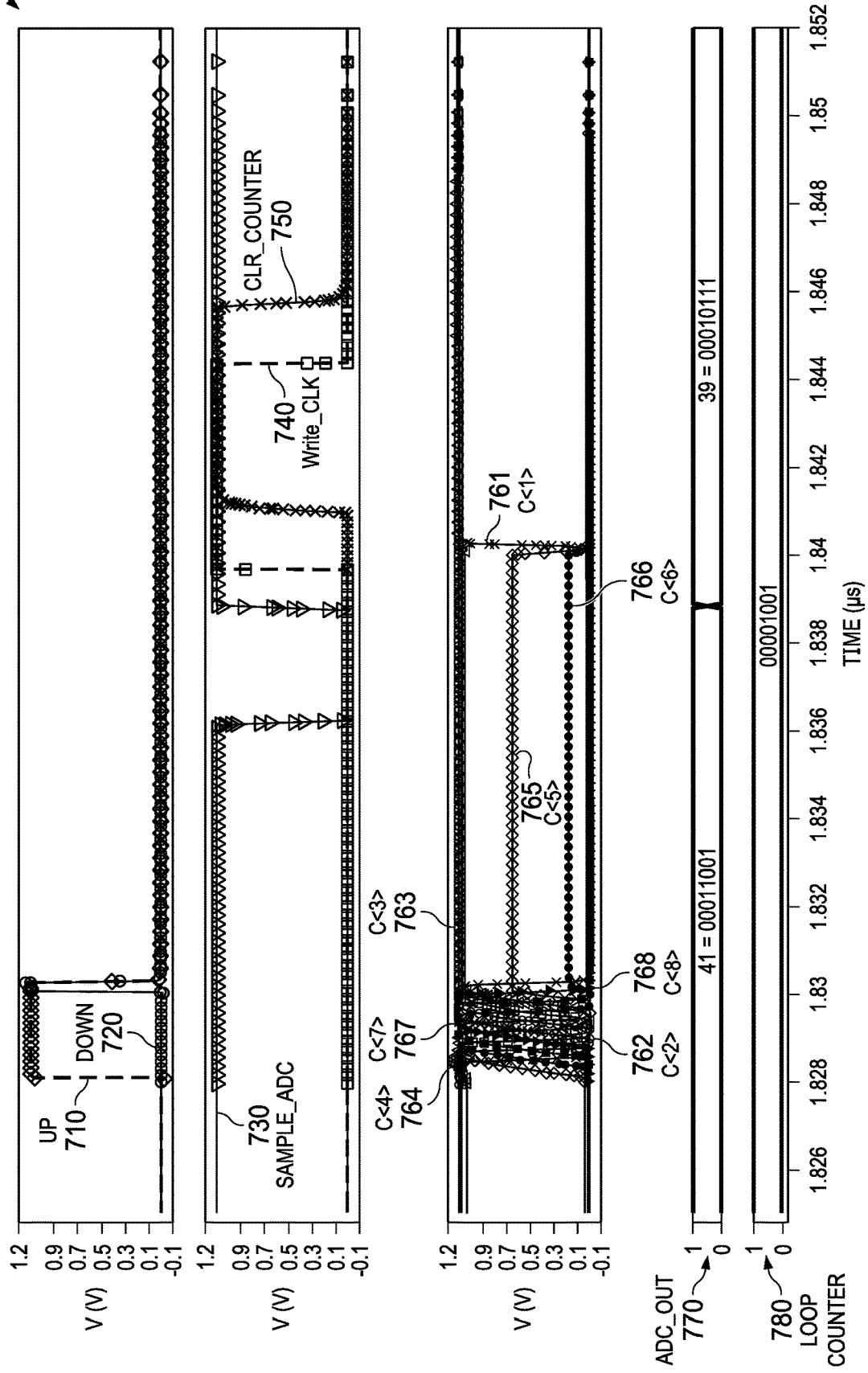
FIG. 8 is a waveform diagram that includes waveforms of the example simulation of FIG. 7 at smaller scale.

The number of storage cell transitions "st_n" (e.g., a propagation of a ring edge from a first storage cell to a next adjacent storage cell) can be determined as st_n=round (SPD/Tst), where (for example) the number of transitions can be determined as the round function of the quantity of the selected phase delay divided by the storage cell capacitor charge time. The number of transitions is captured by the loop counter (e.g., where the number of completed loops is output as the "coarse" output of the M-bit counter 435, and where the number of transitions of a partially completed loop is output by the multiplexer 436). In the simulations of FIG. 7 and FIG. 8, the LOOP COUNTER 780 includes the combined "coarse and fine" digital loop measurements.

FIG. 8 is a waveform diagram that includes waveforms of the example simulation of FIG. 7 at smaller scale. In the diagram 800, the voltage (e.g., analog voltage) of C<5> is sampled responsive to the SAMPLE_ADC 730 pulse starting at around 1.838 microseconds. To sample the voltage of C<5>, the analog sample-and-hold circuit is configured to select (e.g., responsive to the storage cell ring S<8:1> outputs) the intermediate analog voltage developed by the fifth storage cell. The conversion value (e.g., the sampled value) of C<5> and the output of the loop counter are sampled responsive to an assertion of the Write_CLK 740 at around 1.84 microseconds. The conversion value generated by the ADC is the TDC-OUT<N:1> portion of the TDC-OUT<M+3+N:1> bus and the output of the loop counter is the TDC-OUT<M+3+N:N+1> portion of the TDC-OUT<M+3+N:1> bus. The conversion value indicates a first portion of a time measurement (e.g., time measurement value) of a time duration between the start time and the stop time (e.g., of the oscillating time of the storage cell ring) and the loop count value indicates a second portion of a time measurement of the time duration between the start time and the stop time.

The output of the ADC and the two's complement of the output of the ADC are multiplexed based on the direction of phase error. For example, the multiplexer 448 is configured to generate a selected output responsive to the loop direction signal.

Because the ADC is configured to generate samples shortly after the storage cell ring oscillation is stopped and because the storage cell ring is reset after each Write_CLK 740 pulse, the voltage drop on the capacitor of each storage cell due to leakage effects does not significantly impact a minimum operational input frequency. Accordingly, a frequency of the reference clock can be as high as 100 megahertz. In contrast, a maximum operational frequency is generally limited by the speed of the architecture chosen for the ADC.

Figure 9:
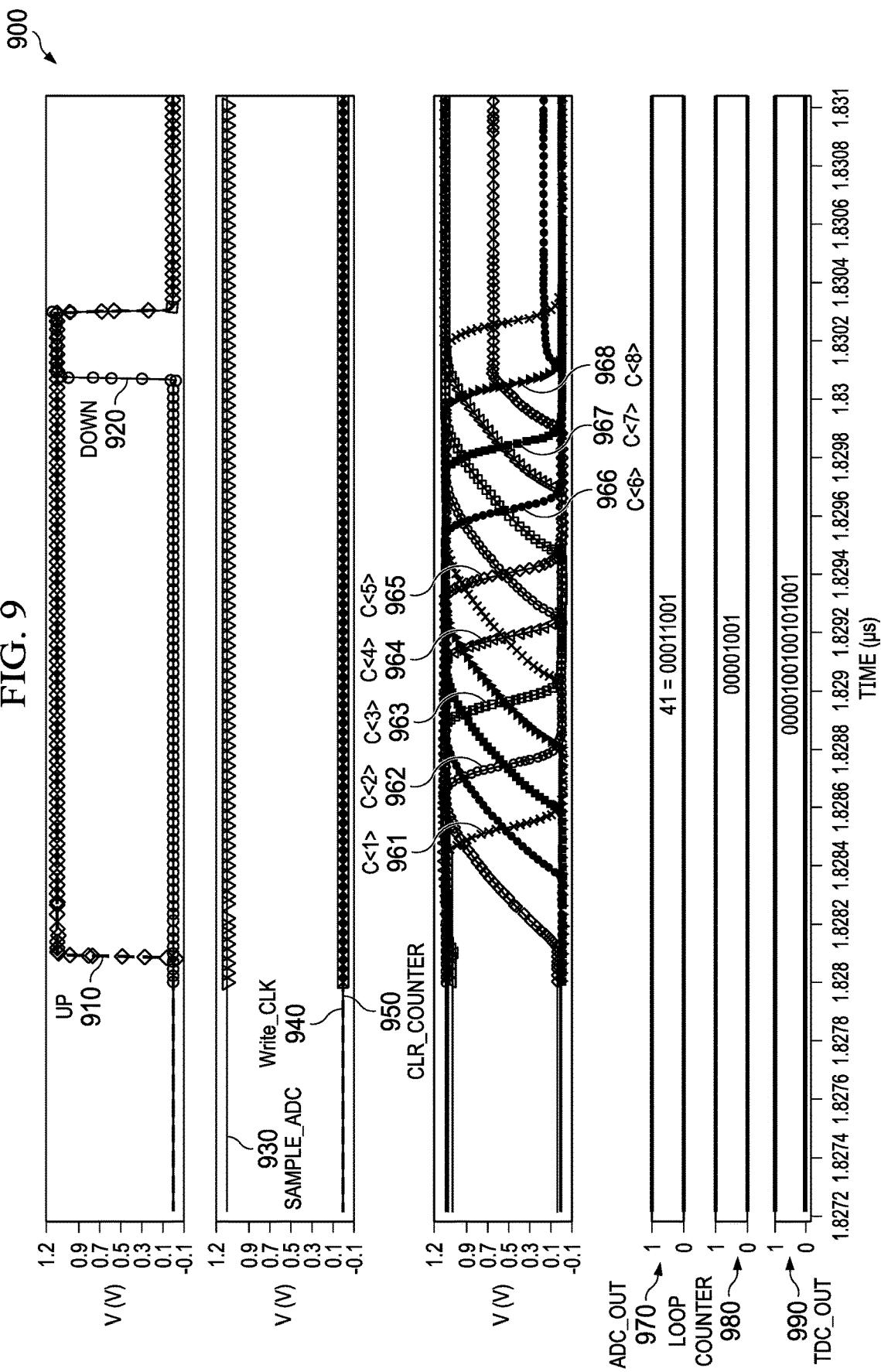
FIG. 9 is a waveform diagram that includes waveforms of an example double-sampling simulation of the example system of FIG. 4.

FIG. 9 is a waveform diagram that includes waveforms of an example double-sampling simulation of the example system of FIG. 4. The diagram 900 includes waveforms of an example simulation using parameters as described hereinabove as well as parameters of a target process selected for manufacture of circuits including techniques for storage cell rings described herein. Example waveforms of the diagram 900 include the signals UP 910, DOWN 920, SAMPLE_ADC 930, Write_CLK 940, CLR_COUNTER 950, C<1> 961, C<2> 962, C<3> 963, C<4> 964, C<5> 965, C<6> 966, C<7> 967, C<8> 968, ADC_OUT 970, LOOP COUNTER 980, and TDC OUT 990.

In the example simulation, a reference clock (e.g., see FIG. 4) is chosen to lead the feedback clock by a selected phase difference (e.g., as indicated by the difference in time of the assertion of the signal UP 910 and the assertion of the signal DOWN 920. The signal UP is asserted (e.g., as a low-to-high transition) by the PFD (e.g., PFD 450) responsive to a phase of the reference clock and the signal DOWN 920 is asserted (e.g., as a low-to-high transition) by the PFD responsive to a phase difference of the DOWN signal relative to the phase of the signal UP 910.

Figure 10:
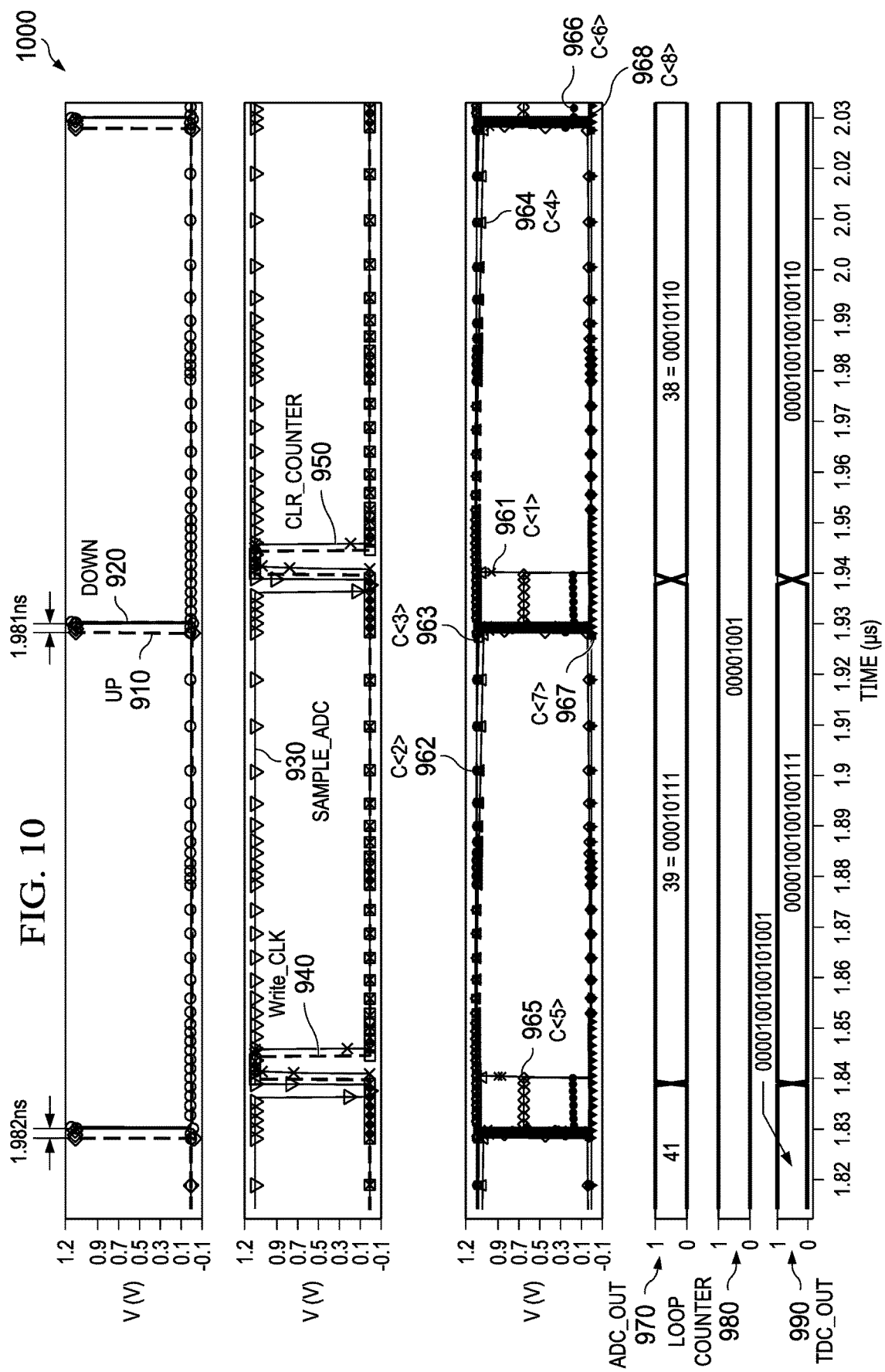
FIG. 10 is a waveform diagram that includes waveforms of the example simulation of FIG. 9 at smaller scale.

A reset pulse (e.g., the signal PFD_RESET generated by PFD 450 of FIG. 4) is generated by the PFD, which is indicated in the simulation as a logical AND function of the signals UP 910 and DOWN 920. The SAMPLE_ADC 930 (e.g., the EN_ADC signal generated by the delay chain and pulse generator 452) is generated in response to the reset pulse (e.g., PFD_RESET), the signal Write_CLK 940 is generated in response to the signal SAMPLE_ADC 930, and the signal CLR_COUNTER 950 is generated in response to the signal Write_CLK 940. In the simulations of FIG. 9 and FIG. 10, the LOOP COUNTER 980 includes the combined "coarse" and "fine" digital loop measurements.

FIG. 10 is a waveform diagram that includes waveforms of the example simulation of FIG. 9 at smaller scale. In the diagram 1000, a first sample of the voltage (e.g., analog voltage) of C<5> is sampled responsive to the SAMPLE_ADC 930 pulse starting at around 1.838 microseconds. The conversion value of C<5> is shown by ADC_OUT 970, which has a value of 39 (e.g., 00100111 in binary) for the first sample, and the value of the LOOP COUNTER 990 is 00001001. The conversion value (e.g., the sampled value) of C<5> and the output of the loop counter are sampled responsive to an assertion of the Write_CLK 940 at around 1.84 microseconds. Because the loop counter value includes the more-significant bits "00001001," and because the conversion value includes the less-significant bits "00100111," the value of TCD_OUT 990 for the first sample is "0000100100100111."

A second sample of the voltage (e.g., analog voltage) of C<5> is sampled responsive to the SAMPLE_ADC 930 pulse starting at around 1.93 microseconds. The conversion value of C<5> is shown by ADC_OUT 970, which has a value of 38 (e.g., 00100110 in binary) for the first sample, and the value of the LOOP COUNTER 990 is 00001001. The conversion value (e.g., the sampled value) of C<5> and the output of the loop counter are sampled responsive to an assertion of the Write_CLK 940 at around 1.94 microseconds. Because the loop counter value includes the more-significant bits "00001001," and because the conversion value includes the less-significant bits "00100110," the value of TCD_OUT 990 for the first sample is "0000100100100110."

Figure 11:
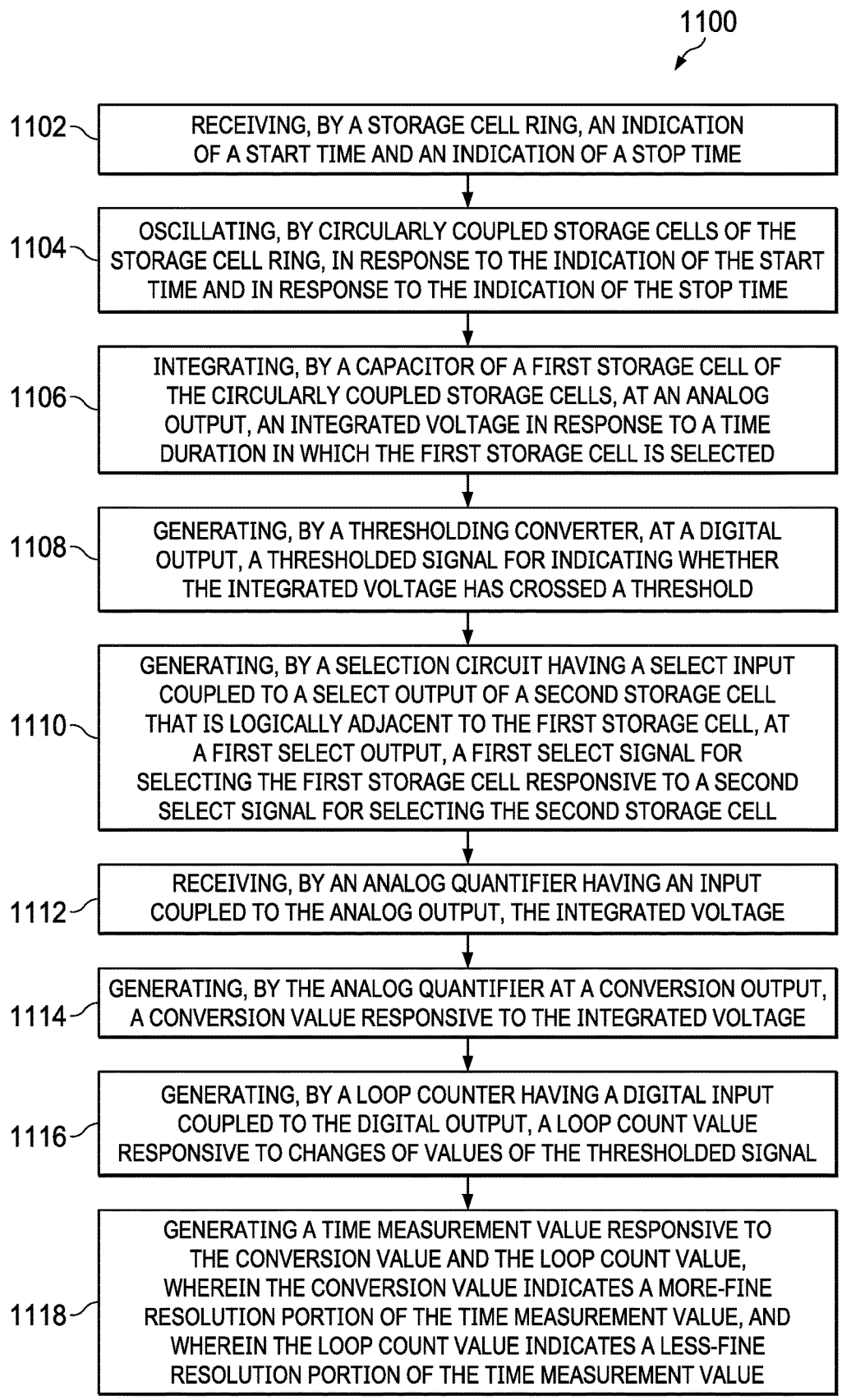
FIG. 11 is a flow diagram of an example method for time-to-digital conversions of the example system of FIG. 4.

FIG. 11 is a flow diagram of an example method of time-to-digital conversions of the example system of FIG. 4. The example method 1100, can include various techniques described herein following. In various implementations, the described operations need not be performed in the described order. In the example method 1100, the method can be initiated at 1102.

At 1102, the method can include receiving, by a storage cell ring, an indication of a start time and an indication of a stop time.

At 1104, the method can include oscillating, by circularly coupled storage cells of the storage cell ring, in response to the indication of the start time and in response to the indication of the stop time.

At 1106, the method can include integrating, by a capacitor of a first storage cell of the circularly coupled storage cells, at an analog output, an integrated voltage in response to a time duration in which the first storage cell is selected.

At 1108, the method can include generating, by a thresholding converter, at a digital output, a thresholded signal for indicating whether the integrated voltage has crossed a threshold.

At 1110, the method can include generating, by a selection circuit having a select input coupled to a select output of a second storage cell that is logically adjacent to the first storage cell, at a first select output, a first select signal for selecting the first storage cell responsive to a second select signal for selecting the second storage cell.

At 1112, the method can include receiving, by an analog quantifier having an input coupled to the analog output, the integrated voltage. Optionally, the integrated voltage can be selected to be received responsive to the first select signal.

At 1114, the method can include generating, by the analog quantifier at a conversion output, a conversion value responsive to the integrated voltage.

At 1116, the method can include generating, by a loop counter having a digital input coupled to the digital output, a loop count value responsive to changes of values of the thresholded signal.

At 1118, the method can optionally include generating a time measurement value responsive to the conversion value and the loop count value, wherein the conversion value indicates a more-fine resolution portion of the time measurement value, and wherein the loop count value indicates a less-fine resolution portion of the time measurement value.

Modifications are possible in the described embodiments, and other embodiments are possible, within the scope of the claims.

What is claimed is:

1. A circuit, comprising:
   a ring coupled to a timing output and having storage cells coupled in a loop, wherein each of the storage cells includes a respective selection circuit having a first input coupled to an output of a respective adjacent storage cell and a second input coupled to the timing output, wherein each of the storage cells includes a respective capacitor and a respective switch that includes a control terminal coupled to a selection output of the respective selection circuit and that includes a current terminal coupled to the respective capacitor, and wherein each of the storage cells includes a respective thresholding converter having an input coupled to the respective capacitor;
   an analog quantifier having analog inputs and digital inputs, wherein each of the analog inputs is coupled to a respective one of the respective capacitors, and wherein each of the digital inputs is coupled to a respective one of the selection outputs of the respective selection circuits; and
   a loop counter having inputs, wherein each input is coupled to a respective one of the outputs of the respective thresholding converters;
      wherein the timing output is adapted to generate an indication of a start time and an indication of a stop time;
      wherein the ring is configured as a ring oscillator that is configured to start oscillating in response to the indication of the start time and to stop oscillating in response to the indication of the stop time;
      wherein each respective capacitor is configured to integrate a respective integrated voltage at a respective analog output responsive to a duration in which the respective switch coupled to the respective capacitor is closed;

wherein each respective selection circuit is configured to generate a respective select signal at the selection output of each respective selection circuit;

wherein the analog quantifier is configured to generate a conversion value at a conversion output responsive to a selected one of the respective integrated voltages, wherein the selected one of the respective integrated voltages is selected in response to at least one of the respective select signals, and wherein the conversion value indicates a first portion of a time measurement of a time duration that extends from the start time to the stop time;

wherein each respective thresholding converter is configured to generate at a respective digital output a respective thresholded signal for indicating whether the respective integrated voltage has crossed a threshold; and wherein the loop counter is configured to generate a loop count value responsive to changes of values of at least some of the respective thresholded signals, and wherein the loop count value indicates a second portion of the time measurement of the time duration that extends from the start time to the stop time.

2. The circuit of claim 1, wherein a resolution in time of the conversion value is more precise than a resolution in time of the loop count value.

3. The circuit of claim 1, wherein the loop count value comprises more-significant bits of a measurement for indicating the time duration that extends from the start time to the stop time.

4. The circuit of claim 3, wherein the conversion value comprises less-significant bits of the measurement for indicating the time duration that extends from the start time to the stop time.

5. The circuit of claim 4, wherein the loop count value comprises a number of completed loop oscillations of the ring that are counted between the start time and the stop time.

6. The circuit of claim 5, wherein the number of completed loop oscillations is incremented responsive to a logical state in which each respective thresholded signal concurrently has a same value as the other respective thresholded signals.

7. The circuit of claim 6, wherein the loop count value comprises a less-than-unity fraction of an oscillation loop that is propagating at the stop time.

8. The circuit of claim 7, wherein the less-than-unity fraction is determined responsive to a number of storage cells that toggle their respective thresholded signals during the less-than-unity fraction of the oscillation loop that is propagating at the stop time.

9. The circuit of claim 8, wherein the number of storage cells that toggle their respective thresholded signals during the less-than-unity fraction of the oscillation loop that is propagating at the stop time, toggle their respective thresholded signals by including rising transitions during a first complete oscillation loop and by including falling transitions during a second oscillation loop that successively follows the first complete oscillation loop.

10. The circuit of claim 9, wherein the loop counter further comprises a first partial loop indicator generator, a second partial loop indicator generator, and a multiplexer that has a first input coupled to an output of the first partial loop indicator generator and has a second input coupled to the output of the second partial loop indicator generator, wherein the multiplexer is arranged to select one of the first partial loop indicator generator and the second partial loop indicator generator responsive to a logic state of a less-significant bit of the number of completed loop oscillations.

11. The circuit of claim 10, wherein the ring is adapted to selectively oscillate in a first direction during a first period of time and in a second direction during a second period of time that follows the first period of time.

12. The circuit of claim 11, wherein the analog quantifier is configured to output a two's complement number responsive to a selection of the first direction or second direction.

13. A system, comprising:

a detector adapted to receive a reference clock and a feedback-controlled clock, wherein the detector is configured to generate at a timing output an indication of a phase relationship between the reference clock and the feedback-controlled clock;

a ring coupled to the timing output and having storage cells coupled in a loop, wherein each of the storage cells includes a respective selection circuit having a first input coupled to an output of a respective adjacent storage cell and a second input coupled to the timing output, wherein each of the storage cells includes a respective capacitor and a respective switch that includes a control terminal coupled to a selection output of the respective selection circuit and that includes a current terminal coupled to the respective capacitor, and wherein each of the storage cells includes a respective thresholding converter having an input coupled to the respective capacitor;

an analog quantifier having analog inputs and digital inputs, wherein each of the analog inputs is coupled to a respective one of the respective capacitors, and wherein each of the digital inputs is coupled to a respective one of the selection outputs of the respective selection circuits; and a loop counter having inputs, wherein each input is coupled to a respective one of the outputs of the respective thresholding converters;

wherein the indication of a phase relationship between the reference clock and the feedback-controlled clock includes an indication of a start time and an indication of a stop time, wherein each respective capacitor is configured to integrate a respective integrated voltage, wherein the analog quantifier is configured to generate a conversion value at a conversion output responsive to a selected one of the respective integrated voltages, wherein the conversion value indicates a first portion of a time measurement of a time duration that extends from the start time to the stop time, wherein each respective thresholding converter is configured to generate at a respective digital output a respective thresholded signal for indicating whether the respective integrated voltage has crossed a threshold, wherein the loop counter is configured to generate a loop count value responsive to changes of values of at least some of the respective thresholded signals, and wherein the loop count value indicates a second portion of the time measurement of the time duration that extends from the start time to the stop time.

14. The system of claim 13, wherein the loop count value comprises a number of completed loop oscillations of the ring, and wherein the number of completed loop oscillations is incremented responsive to a logical state in which each respective thresholded signal concurrently has a same value as the other respective thresholded signals.

15. The system of claim 14, wherein the loop count value comprises a less-than-unity fraction of an oscillation loop that is propagating at the stop time, wherein the less-thanunity fraction is determined responsive to a number of storage cells that toggle their respective thresholded signals during the less-than-unity fraction of the oscillation loop that is propagating at the stop time.

* * * * *